(12) United States Patent
Iyer et al.

(10) Patent No.: US 9,165,687 B2
(45) Date of Patent: Oct. 20, 2015

(54) METHODS AND APPARATUS FOR TESTING AND REPAIRING DIGITAL MEMORY CIRCUITS

(71) Applicant: Cisco Technology, Inc., San Jose, CA (US)

(72) Inventors: Sundar Iyer, Palo Alto, CA (US); Shadab Nazar, Fremont, CA (US); Sanjeev Joshi, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 1 day.

(21) Appl. No.: 14/160,542

(22) Filed: Jan. 21, 2014

(65) Prior Publication Data

US 2014/0344635 A1    Nov. 20, 2014

Related U.S. Application Data

(60) Provisional application No. 61/754,958, filed on Jan. 21, 2013.

(51) Int. Cl.

| G11C 29/00 | (2006.01) |
|---|---|
| G11C 29/08 | (2006.01) |
| G11C 29/56 | (2006.01) |
| G11C 29/04 | (2006.01) |

(52) U.S. Cl.
CPC ............... *G11C 29/70* (2013.01); *G11C 29/08* (2013.01); *G11C 29/56008* (2013.01); *G11C 2029/0401* (2013.01); *G11C 2029/0409* (2013.01)

(58) Field of Classification Search
CPC ............... G11C 2029/0401; G11C 2029/0409; G11C 29/08; G11C 29/56008
USPC ......................................................... 714/718
See application file for complete search history.

(56) References Cited

U.S. PATENT DOCUMENTS

| 6,256,756 | B1* | 7/2001 | Faulk, Jr. ........................ 714/718 |
|---|---|---|---|
| 6,718,356 | B1* | 4/2004 | Rosner et al. .................. 708/404 |
| 6,807,619 | B1* | 10/2004 | Ezra et al. ....................... 711/219 |
| 7,826,377 | B2* | 11/2010 | Pepper ........................... 370/241 |
| 2002/0194558 | A1* | 12/2002 | Wang et al. .................... 714/718 |
| 2004/0243334 | A1* | 12/2004 | Wrigley et al. ................ 702/108 |
| 2007/0183320 | A1* | 8/2007 | Chen et al. ..................... 370/229 |
| 2013/0080694 | A1* | 3/2013 | Iyer et al. ....................... 711/106 |

* cited by examiner

*Primary Examiner* — David Ton
(74) *Attorney, Agent, or Firm* — Edell, Shapiro & Finnan, LLC

(57) ABSTRACT

An ActiveTest solution for memory is disclosed which can search for memory errors during the operation of a product containing digital memory. The ActiveTest system tests memory banks that are not being accessed by normal memory users in order to continually test the memory system in the background. When there is a conflict between the ActiveTest system and a memory user, the memory user is generally given priority.

21 Claims, 30 Drawing Sheets

Figure 3

Small Memory (<100 Mb)

| | | Second Bit Error | |
|---|---|---|---|
| | | Hard Error | Soft Error |
| First Bit Error | Hard Error | NA | NA |
| | Soft Error | NA | Low Probability |

Larger Memory (>400 Mb)

| | | Second Bit Error | |
|---|---|---|---|
| | | Hard Error | Soft Error |
| First Bit Error | Hard Error | Low Probability | High Probability |
| | Soft Error | Low Probability | Medium Probability |

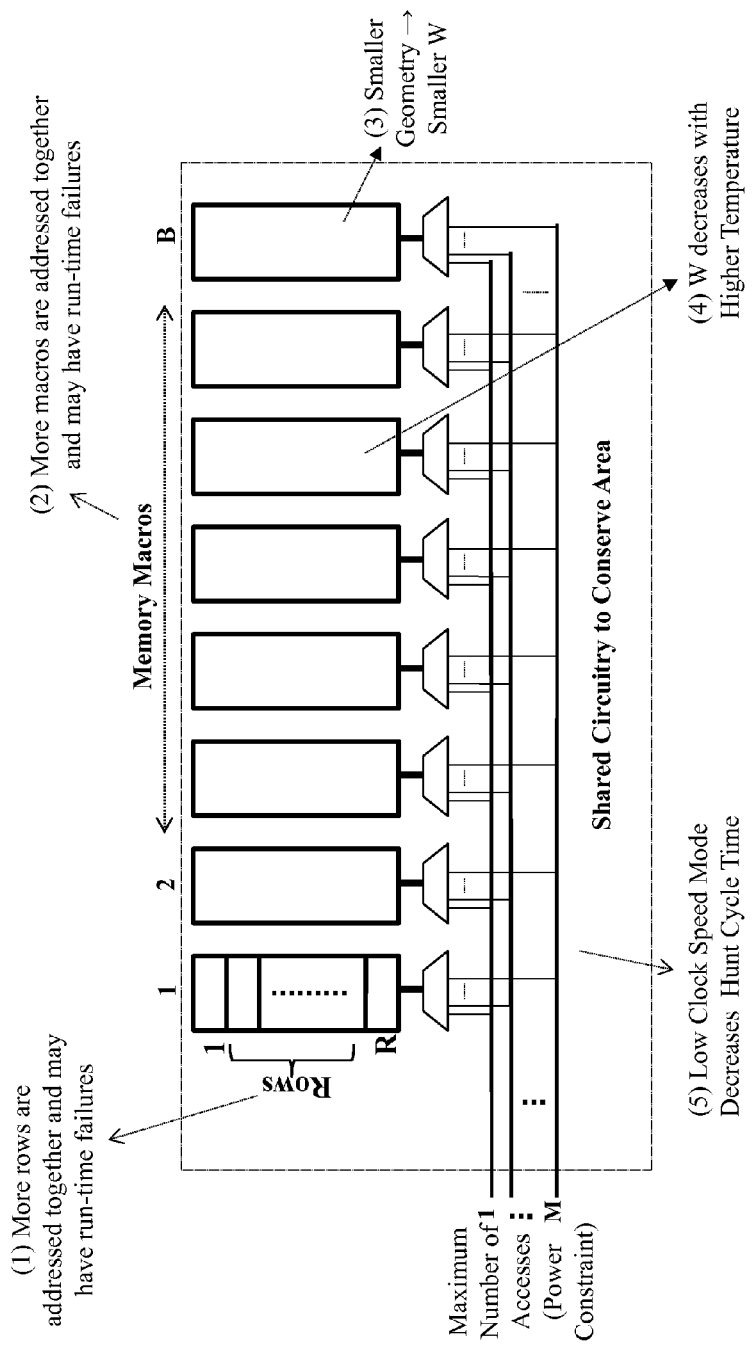

*Sliding Window Constraint Gives Maximum Flexibility for Handling Functional Path Bursts, and When to Provide Hunt Cycles*

Bank with deficit has priority for error hunting

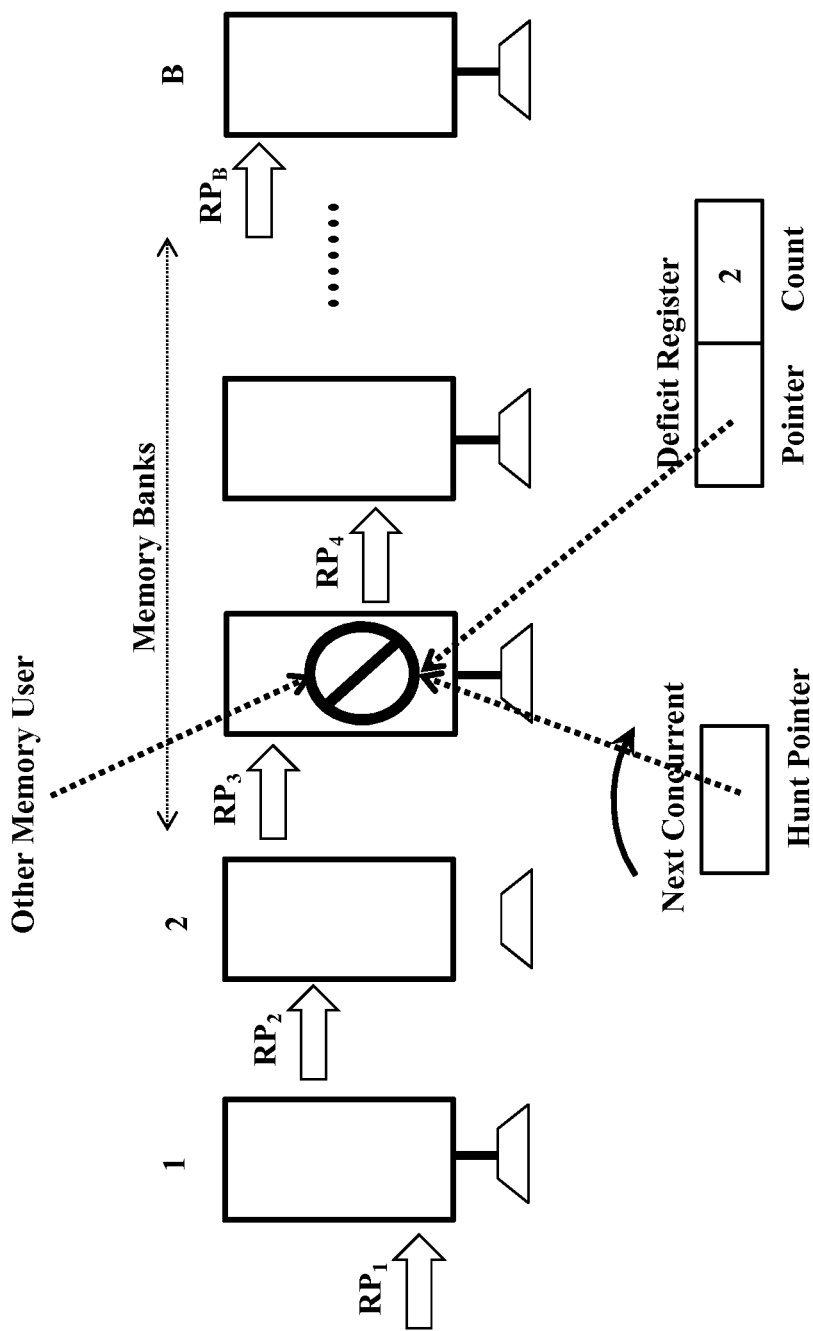

Necessity: Overhead Required for Algorithm $$OV_{nec} \geq max\left(\frac{1}{W - BR + 1}, \frac{R}{W - (B-1)}\right) > \frac{R}{W}$$

Figure 10A

Sufficiency: Result for ActiveTest (with parameter X):

$$OV_{suf} \leq max\left(\frac{X}{W - BR}, \frac{R}{W - BX - 1}\right)$$

Figure 10B

*Nearly Optimal With Minimum Bandwidth Loss*

Figure 12A    Before ActiveTest

Life time of the product → $L = 3 \times 10^{\wedge}8$ sec

One access time → 1 sec $P[H_L]$ → Prob. 1-bit Hard Error - Life = $\alpha$ $P[H_A]$ → Prob. of 1-bit Hard Error - One access period = $\alpha/L$ $P[S_L]$ → Prob. of 1-bit Soft Error - Life = $L.p$ ...using (A)

$P[S_A]$ → Prob. of 1-bit Soft Error - One access period = $p$ (1) $P[H_L].P[H_L] = \alpha.\alpha$ (2) $P[H_L].P[S_L] = \alpha.L.p$ (3a) $P[S_L].P[H_A] = (L.p).(\alpha/L) = \alpha.p$ (Assuming immediate update)

(3b) $P[S_L].P[H_L] = (L.p).\alpha = \alpha.L.p$ (Assuming late update)

(4a) $P[S_L].P[S_A] = (L.p).p$ (Assuming immediate update)

(4b) $P[S_L].P[S_L] = (L.p).(L.p)$ (Assuming late update)

P[2 - Bit Err] = (1) + (2) + (3b) + (4b)

$= \alpha.\alpha + \alpha.L.p + \alpha.L.p + (L.p).(L.p)$

Where :

(A) $P[S_L] = 1 - [(1-p)^{\wedge}2] = 1 - [1 - pL] = p.L$ (using Taylor Series Expansion)

Figure 12B    After ActiveTest

Life time of the product → $L = 3 \times 10^{\wedge}8$ sec
One access time → One scrub time = 1 sec $P[H_L]$ → Prob. 1-bit Hard Error - Life = $\alpha$
$P[H_A]$ → Prob. 1-bit Hard Error - One access period = $\alpha/L$
$P[S_L]$ → Prob. 1-bit Soft Error - Life = $L.p$ ...using(A)
$P[S_A]$ → Prob. 1-bit Soft Error - One access period = $p$ (1) $P[H_L].P[H_A] = \alpha.\alpha/L$
(2) $P[H_L].P[S_A] = \alpha.p$
(3) $P[S_L].P[H_A] = (p.L).(\alpha/L)$
(4) $P[S_L].P[S_A] = (p.L).p$ $P[2\text{-Bit Err}] = (1) + (2) + (3) + (4)$
$= \alpha.\alpha/L + \alpha.p + \alpha.p + p.L.p$ Where :

(A) $P[S_L] = 1 - [(1-p)^{\wedge}2] = 1 - [1-pL] = p.L$
(using Taylor Series Expansion)

METHODS AND APPARATUS FOR TESTING AND REPAIRING DIGITAL MEMORY CIRCUITS

RELATED APPLICATIONS

The present U.S. patent application claims the benefit of the previous U.S. Provisional Patent Application entitled "Methods And Apparatus For Testing And Repairing Digital Memory Circuits" filed on Jan. 21, 2013 having Ser. No. 61/754,958.

TECHNICAL FIELD

The present invention relates to the field of digital memory circuits. In particular, but not by way of limitation, the present invention discloses techniques for testing and repairing digital random access memory circuits.

BACKGROUND

Digital electronic devices use random access memory circuits to store digital information. Modern digital electronic devices such as personal computer systems, tablet computers, and cellular telephones are increasingly using larger and larger amounts of random access memory circuits to store digital data. With larger amounts of random access memory circuits there is a greater probability of a manufacturing defect occurring within the memory section of a complex integrated circuit that may require the entire integrated circuit to be discarded. Furthermore, a subtle manufacturing defect within the memory section of an integrated circuit may not be accurately detected immediately after the integrated circuit has been manufactured thus causing significant reliability problems for the integrated circuit at a later time.

To address manufacturing problems with digital random access memory circuits, most memory manufacturers provide integrated Built-In Self-Test (BIST) and Built-In Self Repair (BISR) systems for the memory system. Built-In Self-Test (BIST) systems are used to test random access memory circuits for memory defects. Built-In Self Repair (BISR) systems are used to reroute memory circuits away from defective memory circuit cells and instead to a set of spare memory circuit cells that are not defective.

Existing Built-In Self-Test (BIST) and Built-In Self Repair (BISR) systems have significantly improved memory reliability. However, there still are some situations wherein subtle memory defects can still cause problems. For example, some manufacturing defects may not be detectable at the time of manufacture but only begin to appear at a later time. Other defects may not occur during initial power-up test but may begin to cause problems during operation. Therefore, it would be desirable to improve memory testing systems such that defects within random access memory circuits can be identified in a more reliable manner.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 3 illustrates how additional soft errors may increase the risk of system down time.

FIG. 5 illustrates a memory system and lists several challenges for the ActiveTest system to handle.

FIGS. 7A, 7B, 7C, 7D, 7E, 7F, 7G, 7H, 7I, 7J, 7K, 7L, 7M, 7N, and 7P illustrate an ActiveTest system in operation.

FIG. 10A lists the overhead required for a memory system with B banks, R rows, and a hunt time of W.

FIG. 10B lists the sufficiency for an ActiveTest system (with parameter X).

FIG. 12A illustrates the probability of a catastrophic error without the ActiveTest system.

FIG. 12B illustrates the probability of a catastrophic error with the ActiveTest system.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
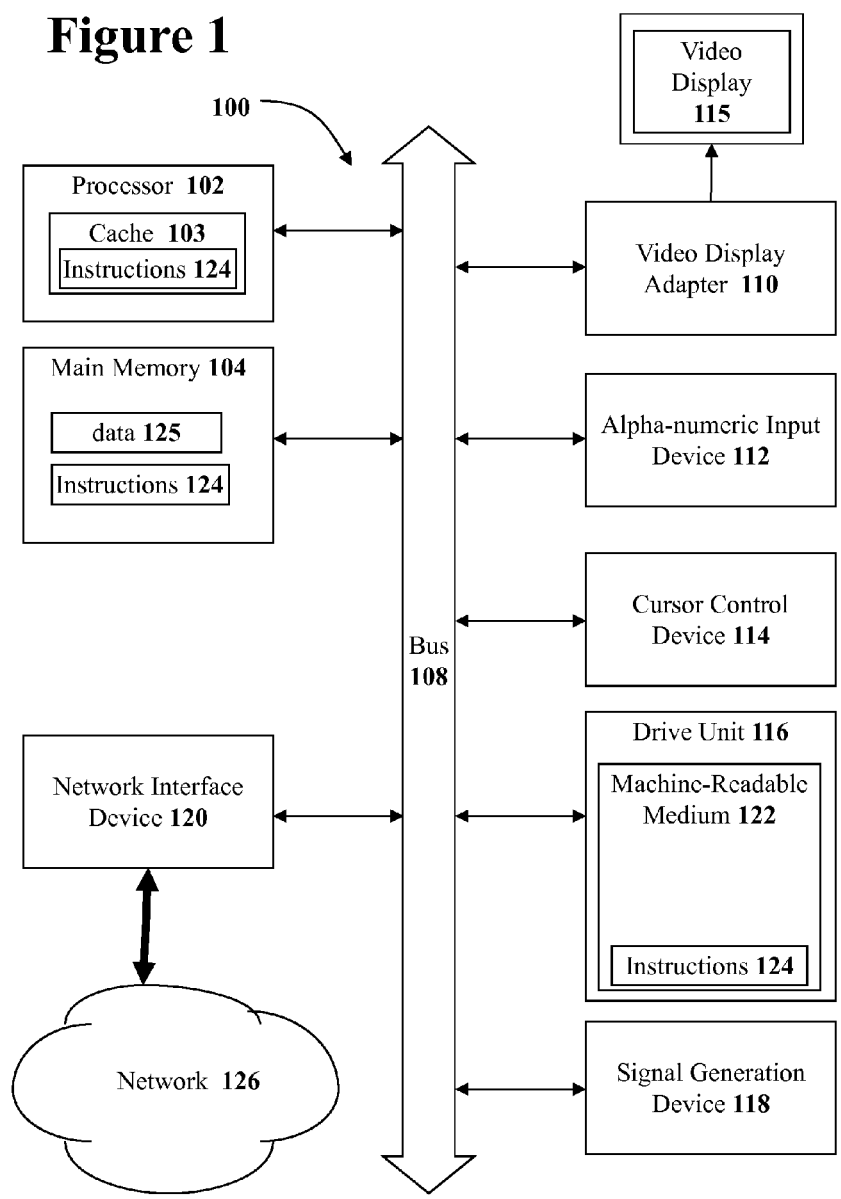
FIG. 1 illustrates a computer system within which a set of instructions, for causing the machine to perform any one or more of the methodologies discussed herein, may be executed.

The present disclosure concerns digital computer systems. FIG. 1 illustrates a diagrammatic representation of a machine in the example form of a computer system 100 that may be used to implement portions of the present disclosure. Within computer system 100 of FIG. 1, there are a set of instructions 124 that may be executed for causing the machine to perform any one or more of the methodologies discussed within this document. Furthermore, while only a single computer is illustrated, the term "computer" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well known File Transport Protocol (FTP). While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Memory Issues in Large Capacity ASICs

Application Specific Integrated Circuits (ASICs) with large memory systems often have at least two common manufacturing problems: integrated circuit yield and integrated circuit reliability. The larger an integrated circuit is, the more likely that it will have a manufacturing defect within it due to a contaminant or other manufacturing problem. Thus, the manufacturing yield will drop. All manufacturers use integrated circuit testing to identify and then discard integrated circuits found to be defective.

However, even when an integrated circuit passes all of the post-manufacturing tests, that integrated circuit may still have problems. For example, the integrated circuit may have a manufacturing defect that only becomes apparent after a certain amount of usage. With such integrated circuits that pass the initial tests but later exhibit problems, there may be reliability problem. Reliability problems can be one of the most difficult and costly manufacturing defect problems since reliability problems can lead to high numbers of product returns, costly repairs, and product recalls.

Since the memory circuitry within an Application Specific Integrated Circuit (ASIC) often uses a large amount of the die area of the ASIC, the memory circuitry needs to be very thoroughly tested before the integrated circuit is offered for sale to customers. Furthermore, the memory circuitry of shipped integrated circuits should be tested regularly during operation to ensure that the memory circuitry in the integrated circuit continues to work properly. Certain defects that occur in the memory circuit that are consistently detected may be referred to as 'hard errors'.

To handle the continued memory testing of integrated circuits that have passed initial tests and have been placed into electronic products many ASIC vendors typically employ Built-In Self-Test (BIST), Built-In Self-Repair (BISR), runtime solutions and additional row/column, address redundancy, and other solutions. Although these continued testing solutions help with reliability issues, there are still many situations wherein an ASIC that contains a large memory system will fail due to a defect within the memory system.

A significant problem often encountered within integrated circuit memory systems are double-bit errors (two erroneous bits within a single data word). Single-bit errors can generally be handled with Error Correcting Codes (ECC) but double-bit errors can system failures. The probability of double bit errors increases in ASICs with large memory capacity. Such double bit errors can cause catastrophic failure when the double-bit error is not properly detected and handled. The present document presents a solution this this problem: an active test system that performs aware pro-active memory error hunting and memory repair during run-time. The test system operates with no or minimal software intervention. This document may refer to the disclosed test system an ActiveTest system since it may test the memory of a system while the digital system is actively being used.

Figure 2A:
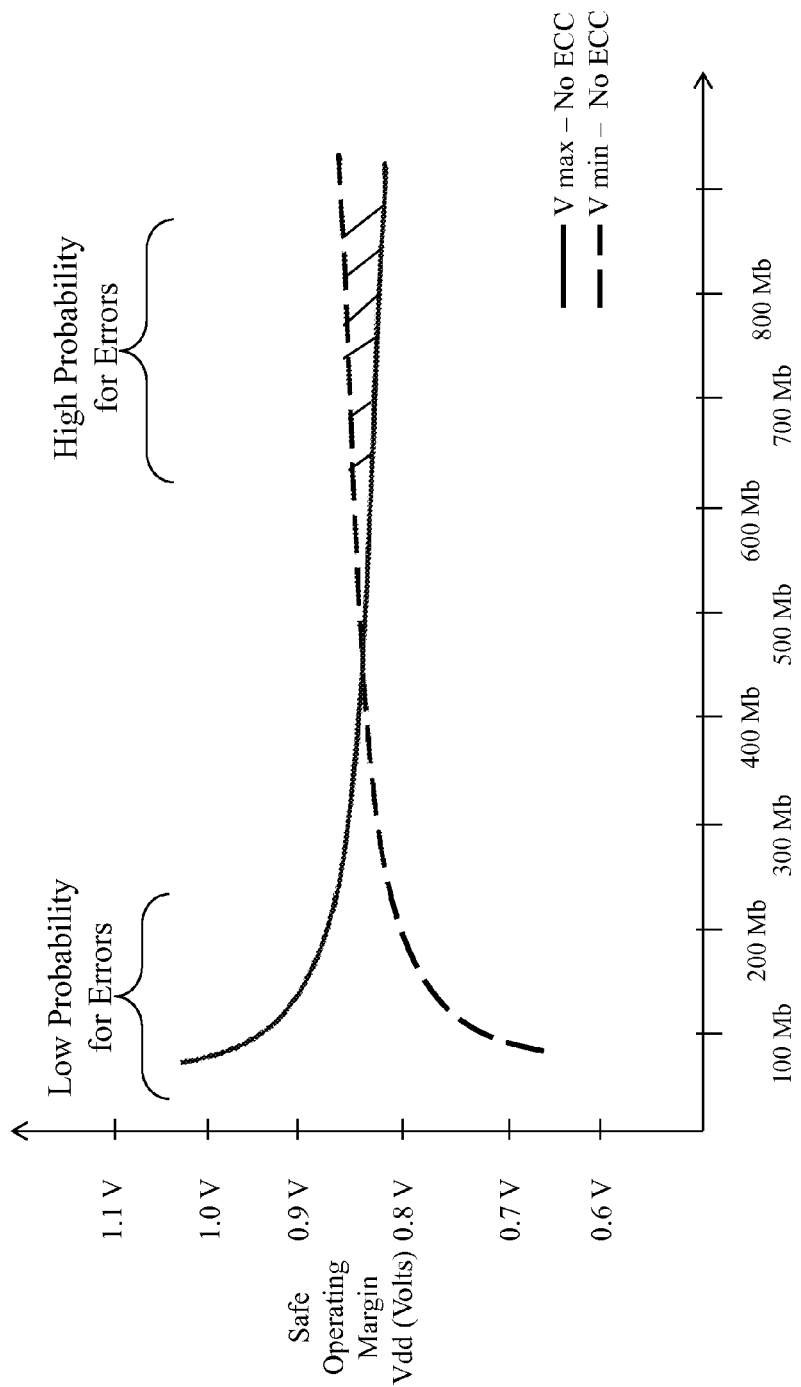
FIG. 2A illustrates a graph that shows how it is hard to create a safe operating margin for hard errors in large capacity memory ASICs.
Figure 2B:
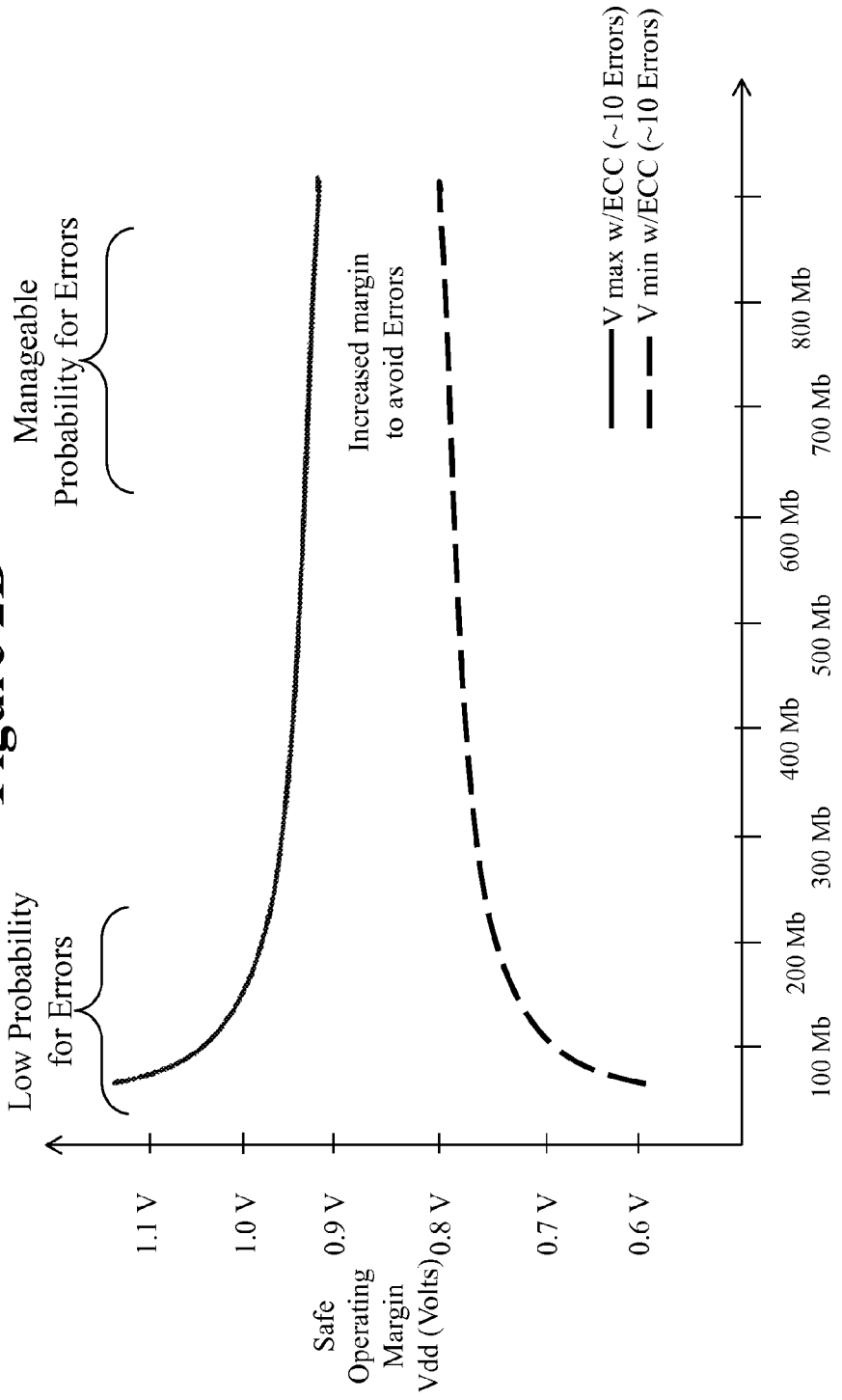
FIG. 2B illustrates a graph that shows how a safe operating margin for hard errors may be created by using Error-Correcting Code (ECC) protection in large capacity memory ASICs.

FIG. 2A contains a graph that illustrates how it is very difficult to create a safe operating margin for hard errors in large capacity memory ASICs. These errors can result in system downtime. A current solution often employed is to use SECDED Error-Correcting Code (ECC) protection. FIG. 2B illustrates a graph that shows how a reasonable safe operating margin for hard errors may be created by using Error-Correcting Code (ECC) protection in large capacity memory ASICs.

FIG. 3 illustrates how additional soft errors may increase the risk of system downtime. Furthermore, large memory capacity ASIC designs are more prone to catastrophic double-bit failures that can often crash a digital system. To deal with the potential presence of soft errors, it is very important to proactively and deterministically locate and repair any memory system errors to prevent system down time.

ActiveTest System Overview

Figure 4A:
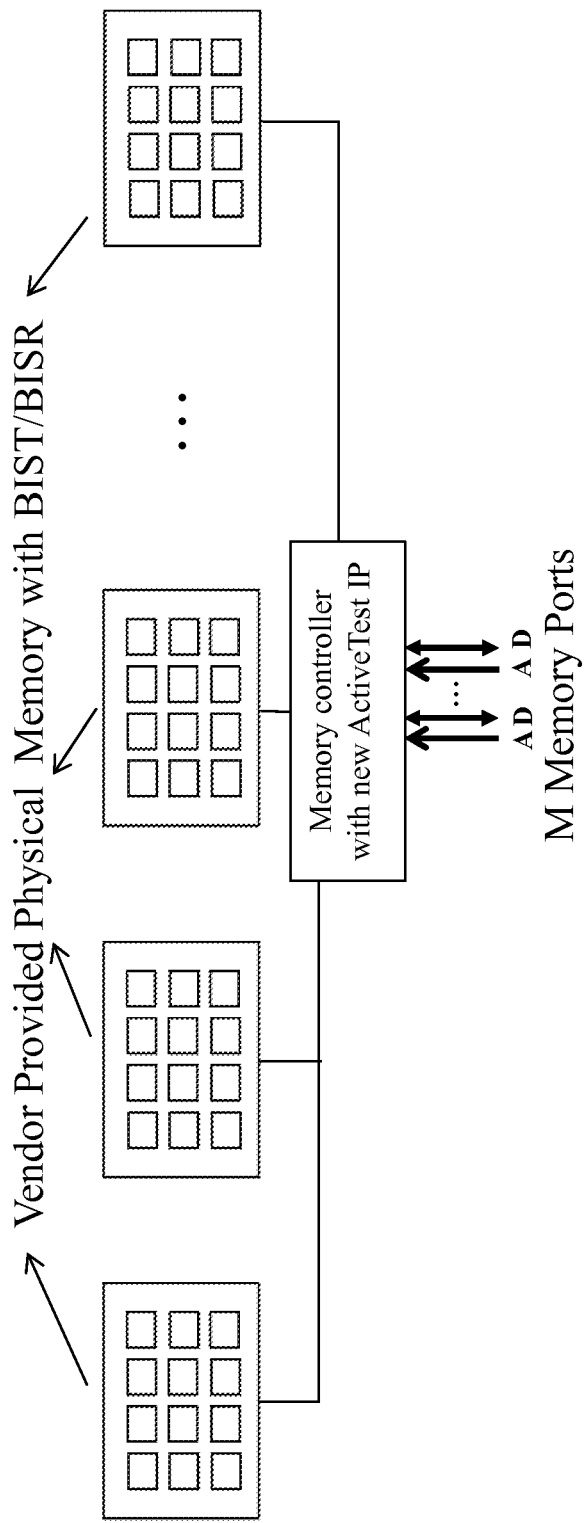
FIG. 4A illustrates a block diagram of how the proposed ActiveTest system can be integrated into a memory system.

FIG. 4A illustrates a block diagram of how the proposed ActiveTest system can be integrated into a typical memory system. As illustrated in FIG. 4A, the ActiveTest code (ActiveTest IP) may be integrated into a memory controller that works with vendor provided physical memory. The vendor provided physical memory may have its own Built-In Self-Test (BIST) and Built-In Self-Repair (BISR) systems. The ActiveTest system provides additional testing capabilities beyond that provided by the BIST and BISR of the vendor provided physical memory circuits.

The ActiveTest IP implements a background testing system for the memory system. The ActiveTest memory testing is proactive in that the ActiveTest system looks for possible errors during normal operation. When errors are detected by the ActiveTest, those errors may be corrected during run-time. In some systems, an error may be corrected by using hardware enabled remapping of faulty memory locations during run-time. The ActiveTest IP provides the ability to actively correct errors detected on a functional path.

Figure 4B:
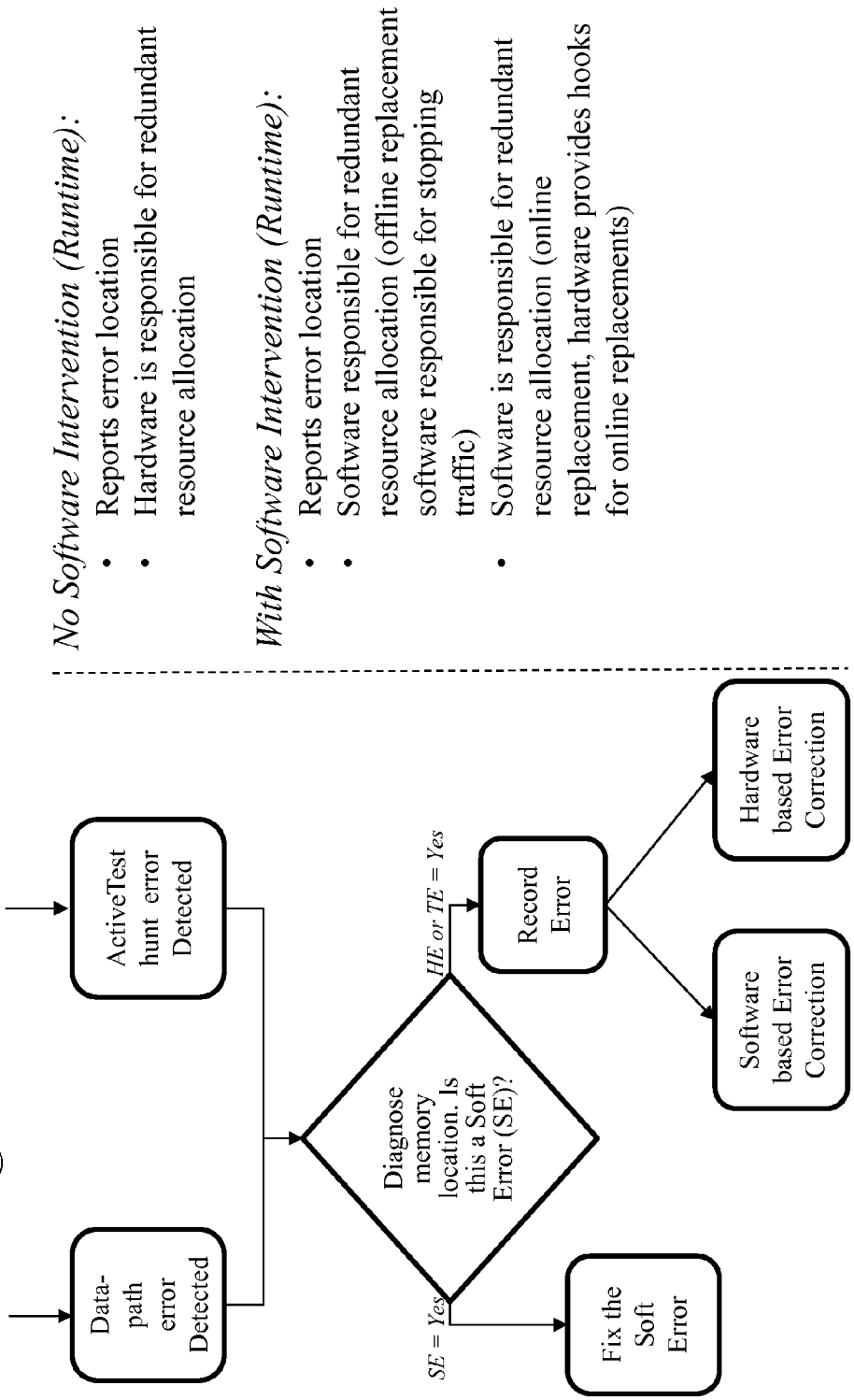
FIG. 4B illustrates a flowchart that describes how the ActiveTest IP may behave when an error is detected.

FIG. 4B illustrates a flowchart that describes how the ActiveTest IP may behave when an error is detected. Errors may be handled with or without software intervention.

ActiveTest System Overview

The ActiveTest system deterministically tests memory systems in order to minimize system down time. The ActiveTest IP may be created in a Hardware Design Language (HDL) form that is parameterized such that it may be used with any Functional Memory Configuration tool. The parameters that may be adjusted may include but are not limited to #Ports, #Memory Accesses, memory width, memory depth, #Macros, Frequency, etc. Once provided with the proper parameter information, a synthesis tool may be used to synthesize the ActiveTest circuitry for use within a memory controller.

The ActiveTest system has been designed to be mathematically optimal such that the ActiveTest system very efficiently tests every memory location in the memory system. The optimal testing system minimizes ActiveTest IP memory bandwidth usage, power usage, and other factors such that the normal usage of the memory system is not impeded.

The ActiveTest system may be configurable In-field in order to manage different system error profiles. The ActiveTest system has been exhaustively formally verified. The ActiveTest system has a reporting capability that can be used to provide detailed logs. In operation, the ActiveTest IP may improve system memory downtime by multiple orders of magnitude ($\sim 10^8$).

Challenges For ActiveTest System

FIG. 5 illustrates a memory system and lists several challenges that the ActiveTest system should be able to handle. With a memory system, (1) more rows may be addressed together and may have run-time failures. (2) More memory macros may be addressed together and may have run-time failures. (3) Smaller memory geometry may lead to a smaller memory hunting time (W). (4) The memory hunting time W decreases with higher temperature. (5) A low clock speed mode for the memory system decreases the Hunt cycle time for the ActiveTest system.

ActiveTest System For Memory Testing

Figure 6A:
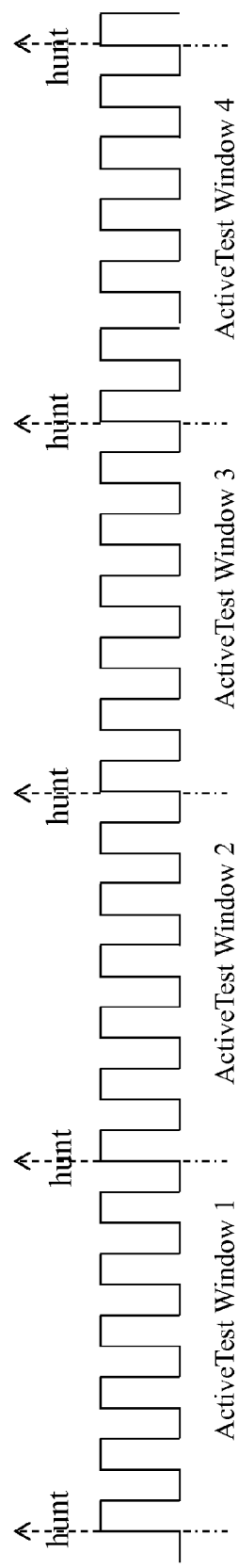
FIG. 6A illustrates a simple system that may be used which uses X hunting (testing) time slots in every Y consecutive timeslots.

The ActiveTest system operates by reserving a few memory cycles (referred to as 'idle' cycles because the memory cannot be used for normal operation during these reserved memory cycles) and using those reserved memory cycles for testing memory locations in the memory system. FIG. 6A illustrates a simple system that may be used which uses X hunting (testing) time slots in every Y consecutive timeslots. The Y timeslots form a fixed testing window in which X timeslots are taken up for testing. Thus, the system disclosed in FIG. 6A is a fixed time division multiplexing (TDM) system.

The fixed time division multiplexing (TDM) system of FIG. 6A provides one method of looking for memory issues in the memory system but the fixed TDM system always accesses the memory at a fixed time. The fixed TDM system of FIG. 6A accesses the memory for testing whether or not other entities may need to access memory system. Thus, it would be desirable to improve the system by considering the needs of other entities that access the memory system being tested by the ActiveTest system.

Figure 6B:
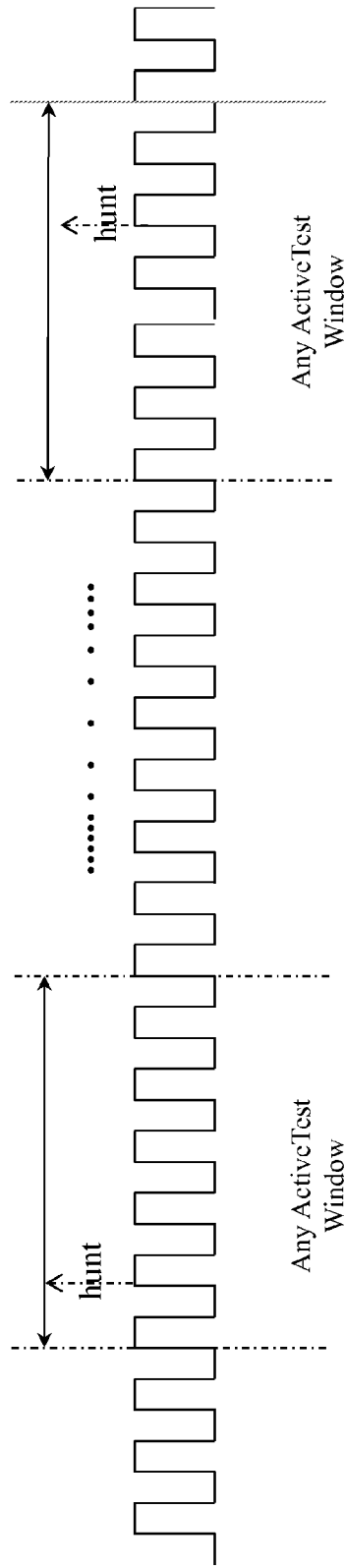
FIG. 6B illustrates an improved interface for an Active test system that uses a sliding window wherein the specific time when a particular test occurs may vary as long as the required testing occurs.

To improve upon the testing system, the ActiveTest system may instead be more flexible. FIG. 6B illustrates an improved interface for an Active test system that uses a sliding window wherein the specific time when a particular test occurs may vary as long as all of the required testing occurs eventually. This sliding window based system allows other memory users to have uninterrupted bust accesses to the memory system. In this manner applications that require high-speed burst accesses to the memory system will not be regularly interrupted just to perform routine testing of the memory system.

The ActiveTest system has various performance metrics. The ActiveTest overhead is defined as X/Y where the X number of time slots required for testing in every Y timeslots. This is the 'background' memory bandwidth used by the ActiveTest IP in order to perform testing on the memory system. The Burst Tolerance is defined as Y-X; this is the maximum number of consecutive memory timeslot accesses that may be performed by other entities without allowing for a memory testing timeslot access.

In one analysis, one may consider the simple case when the system is required to provide X=1 idle time slots for memory testing in every Y timeslots. However, in practice, Y is much larger than X for most implementations. For example, Y may be approximately $10^6$. The ActiveTest IP may support many different values of M wherein M is the number of simultaneous memory access to the memory system.

Example of the ActiveTest System In Operation

Figure 7A:
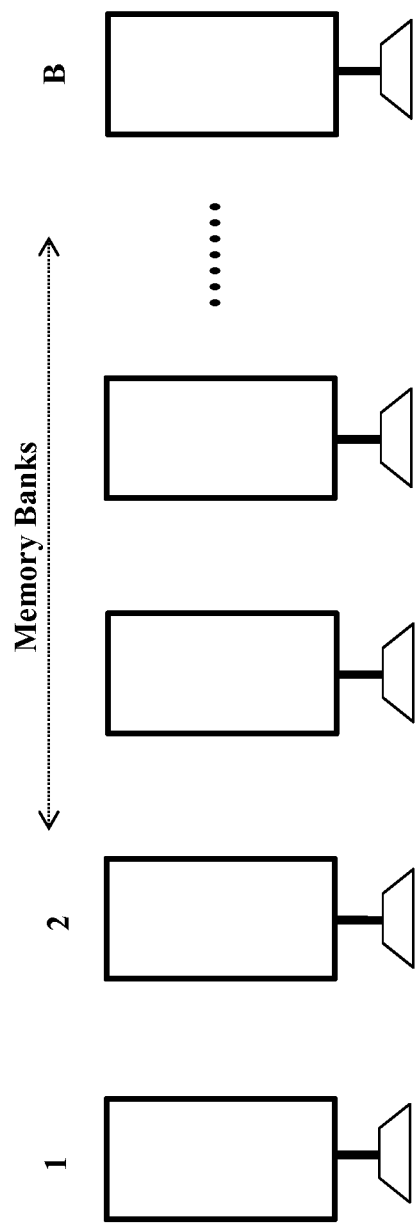
Figure 7B:
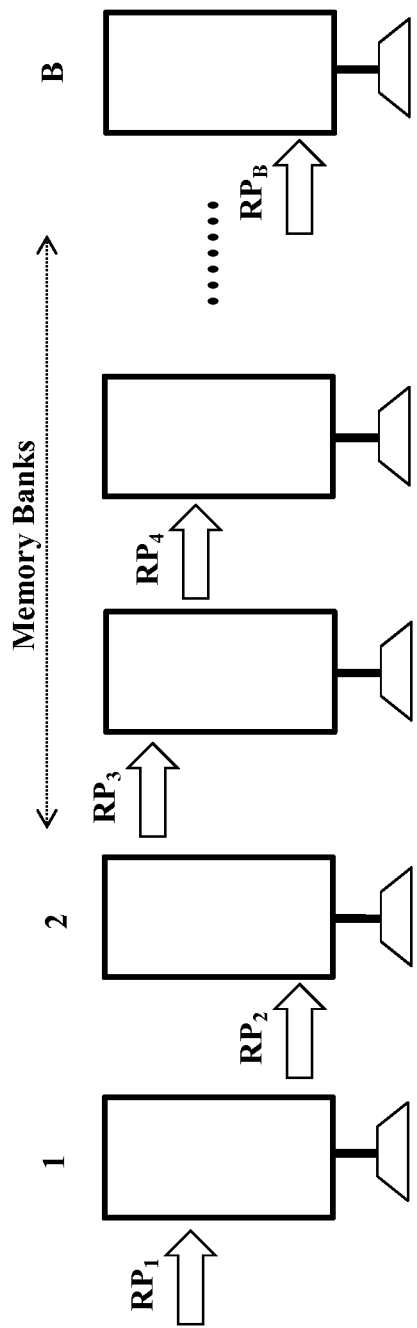
Figure 7C:
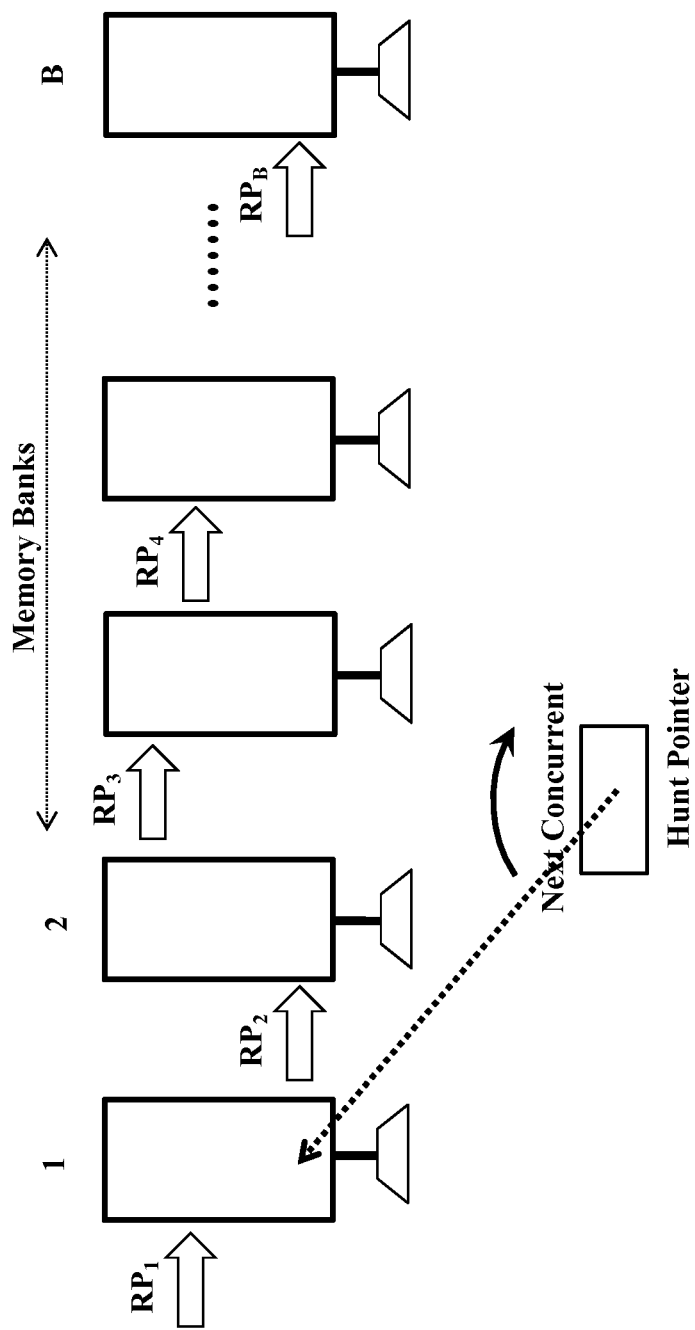
Figure 7D:
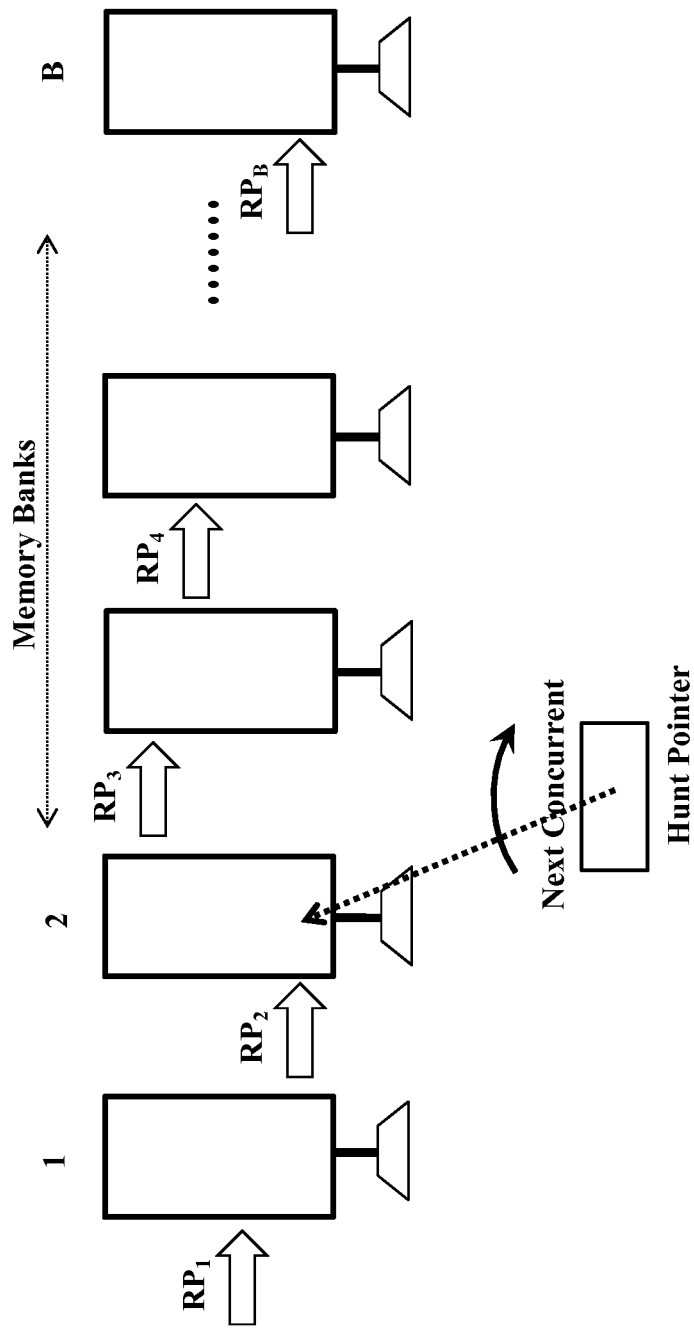
Figure 7E:
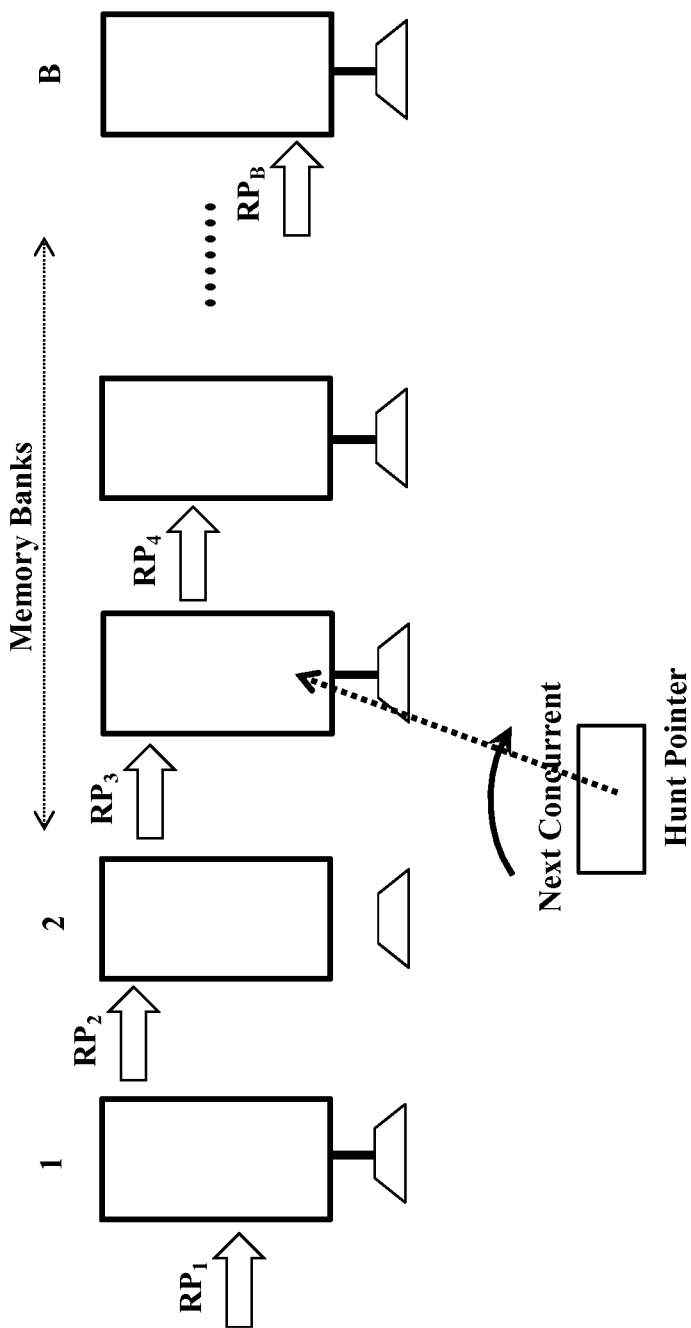
Figure 7F:
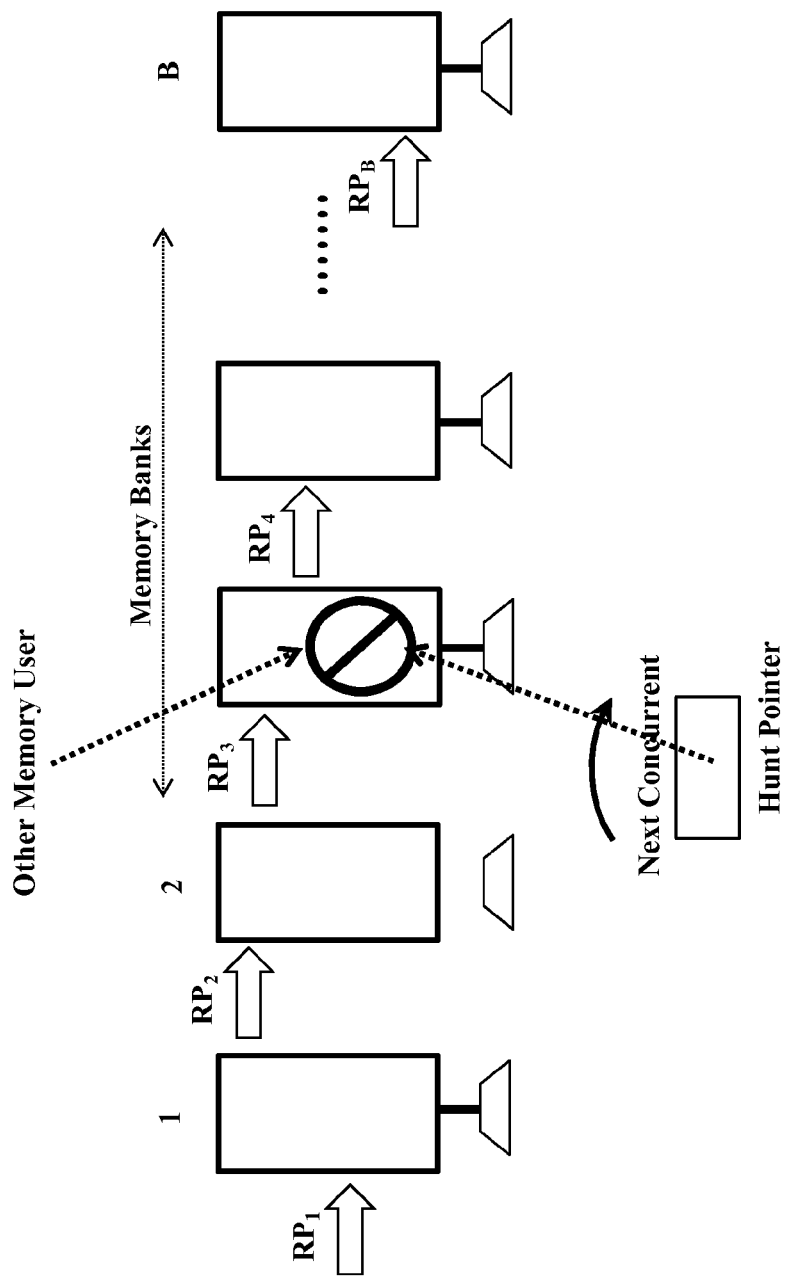
Figure 7G:
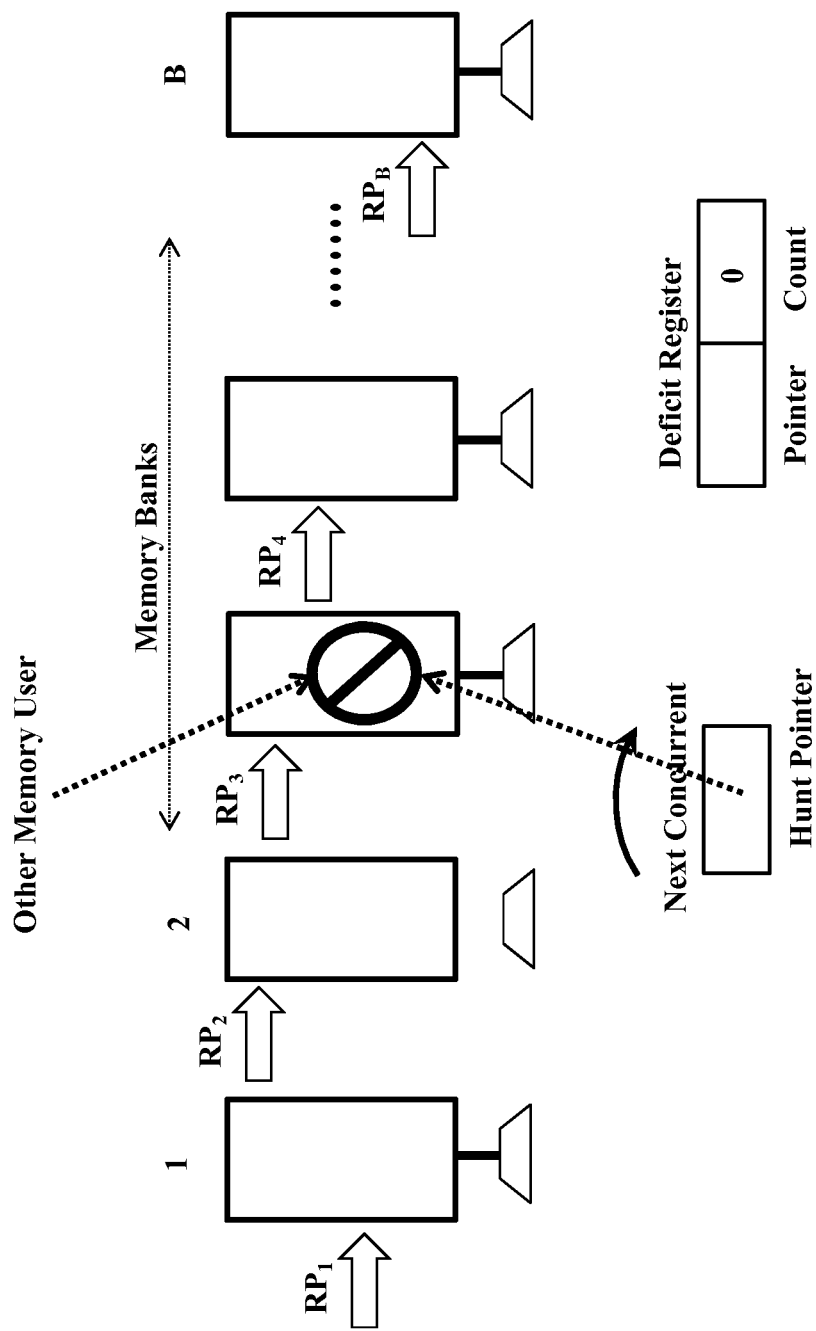
Figure 7H:
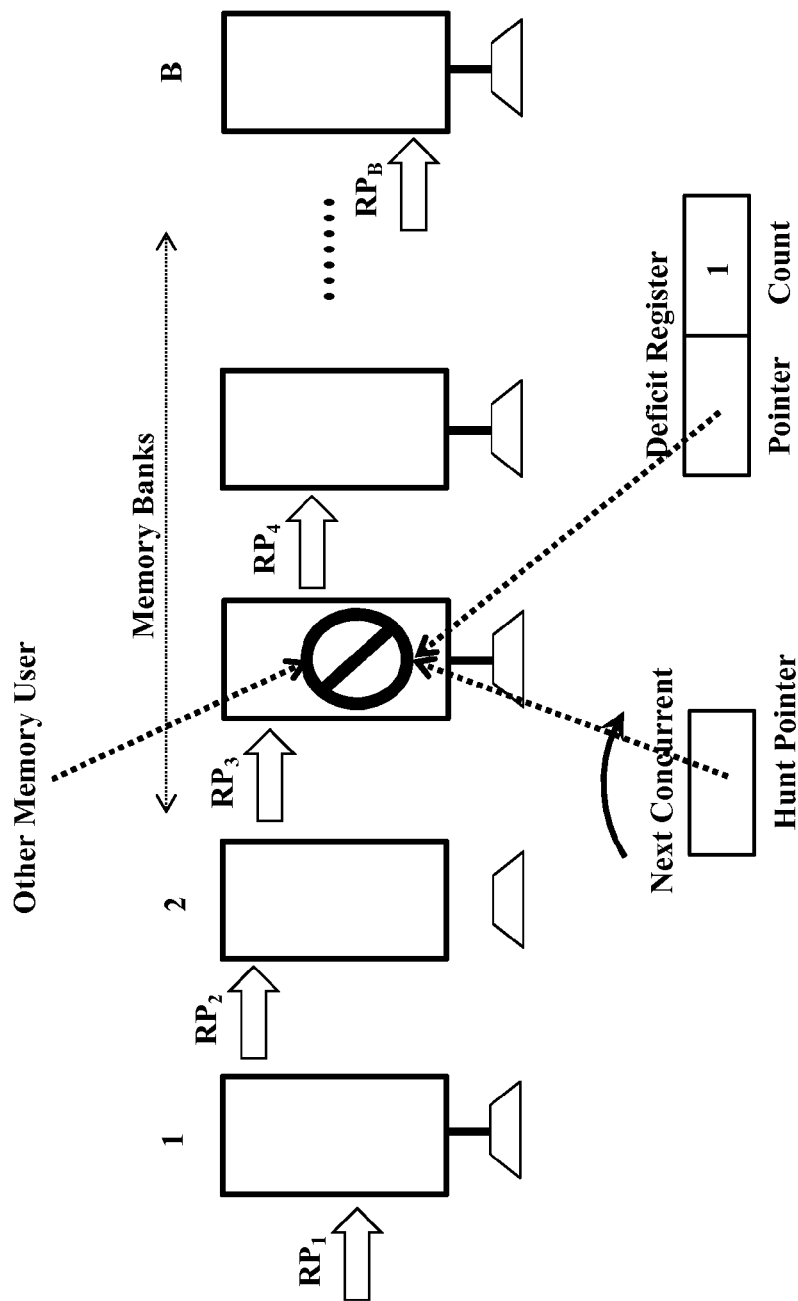
Figure 7I:
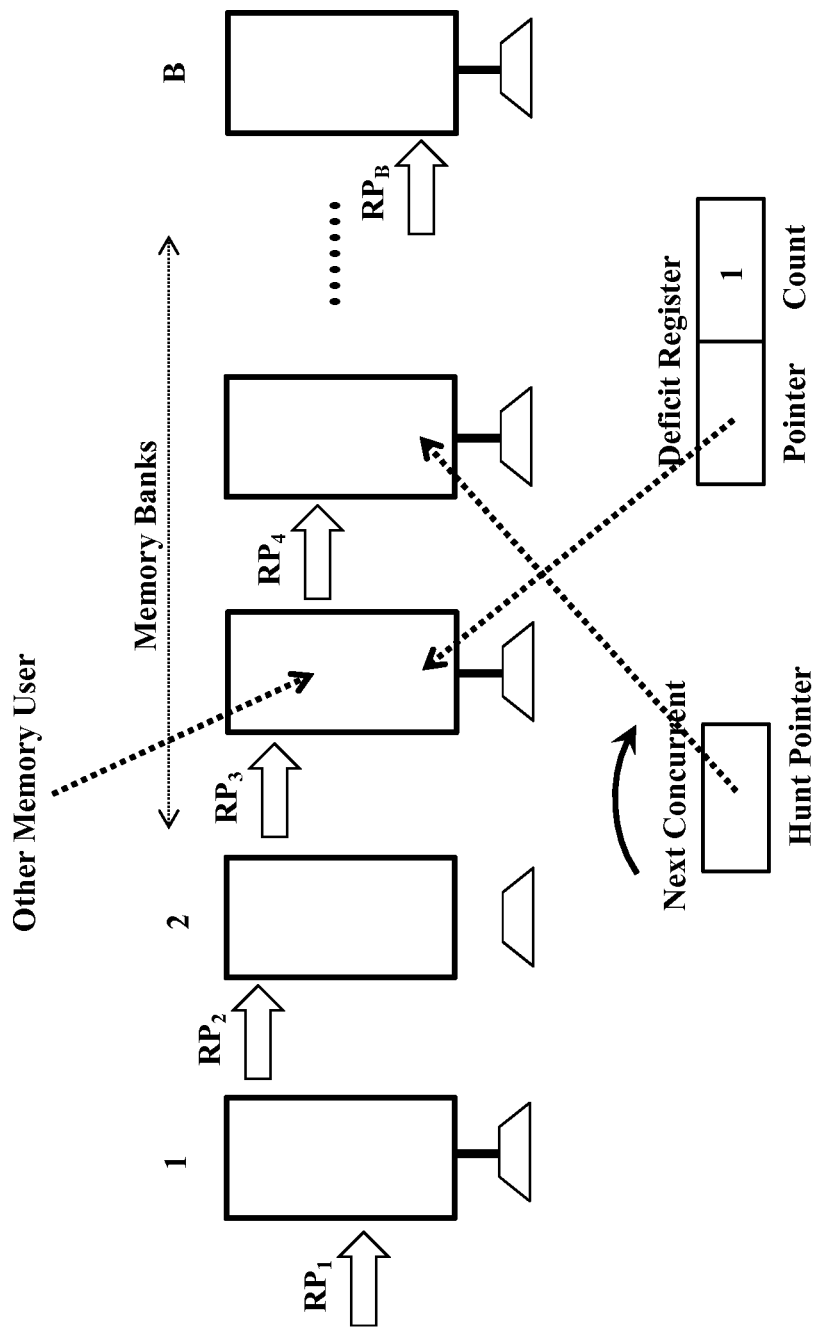
Figure 7J:
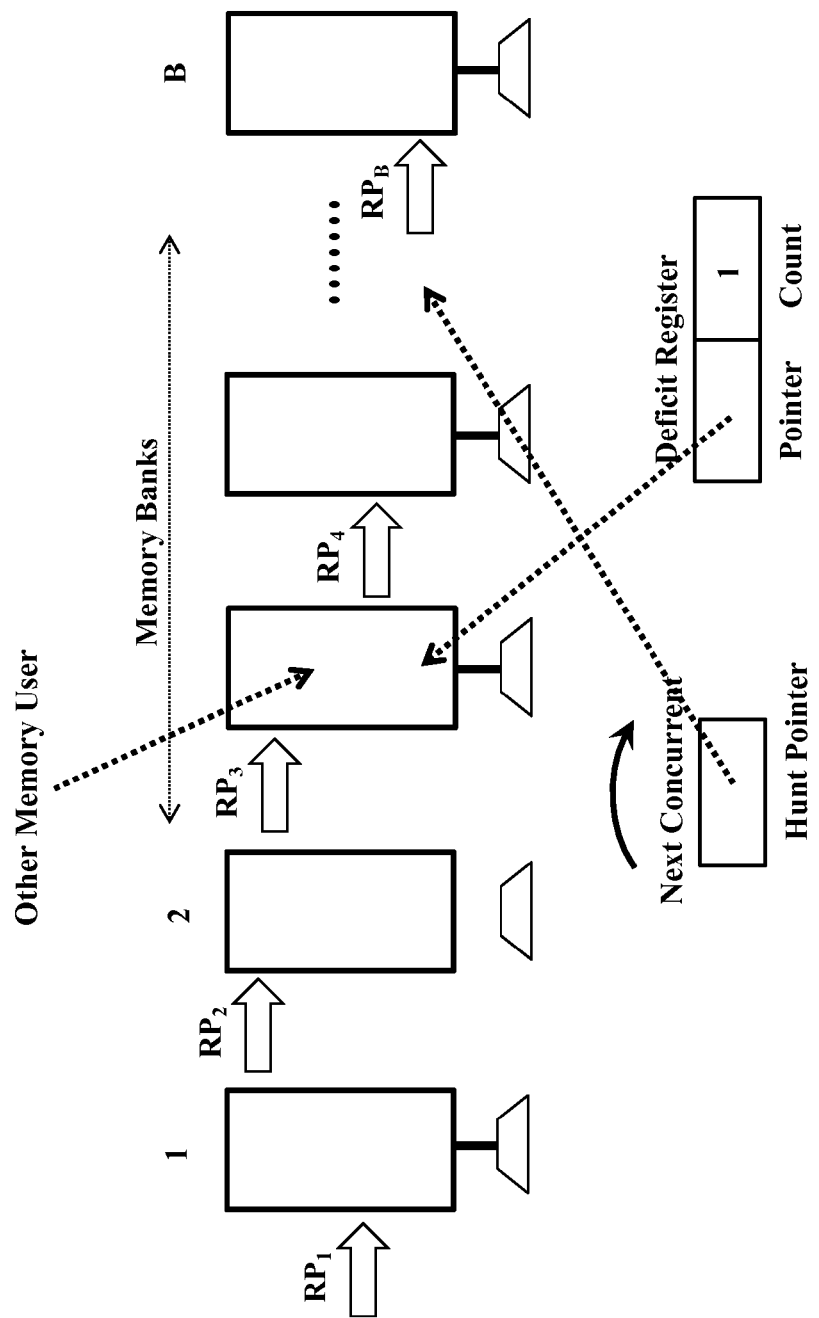
Figure 7K:
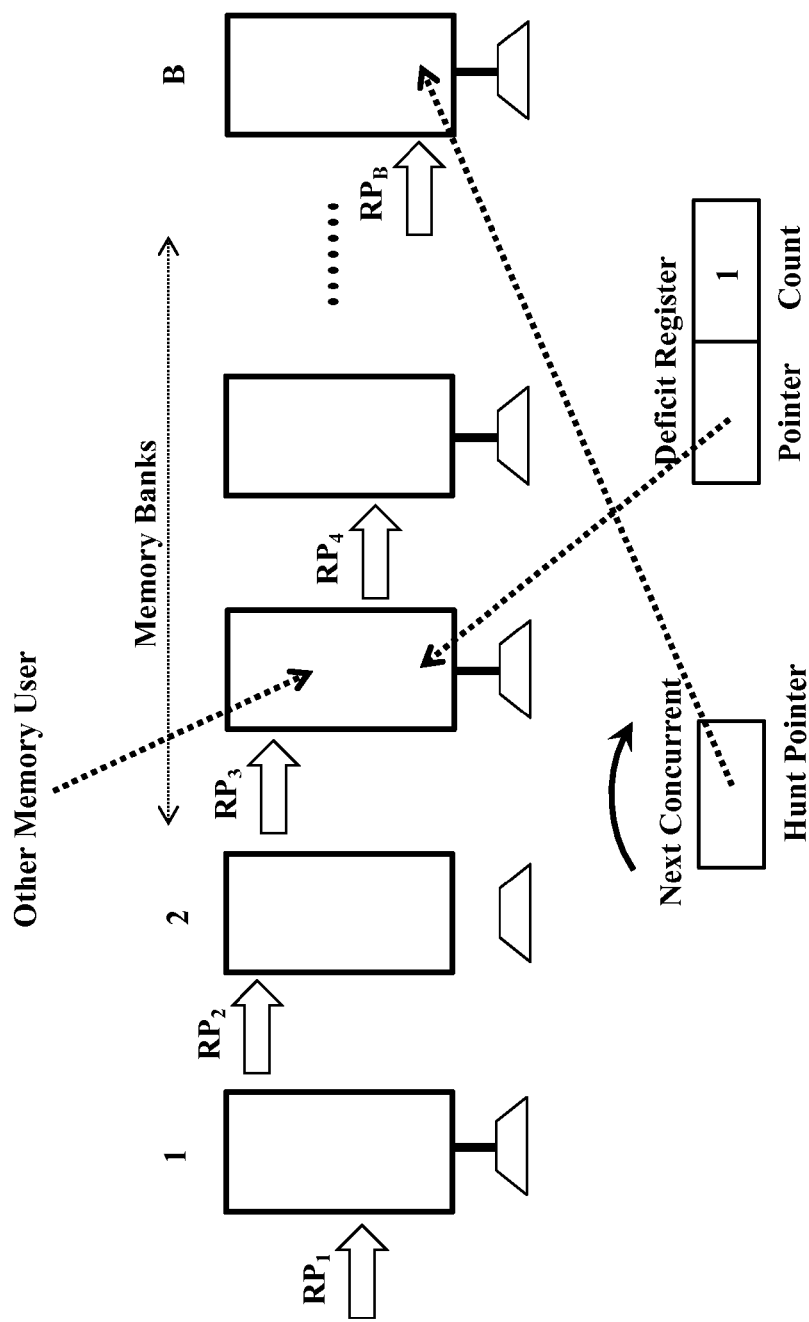
Figure 7L:
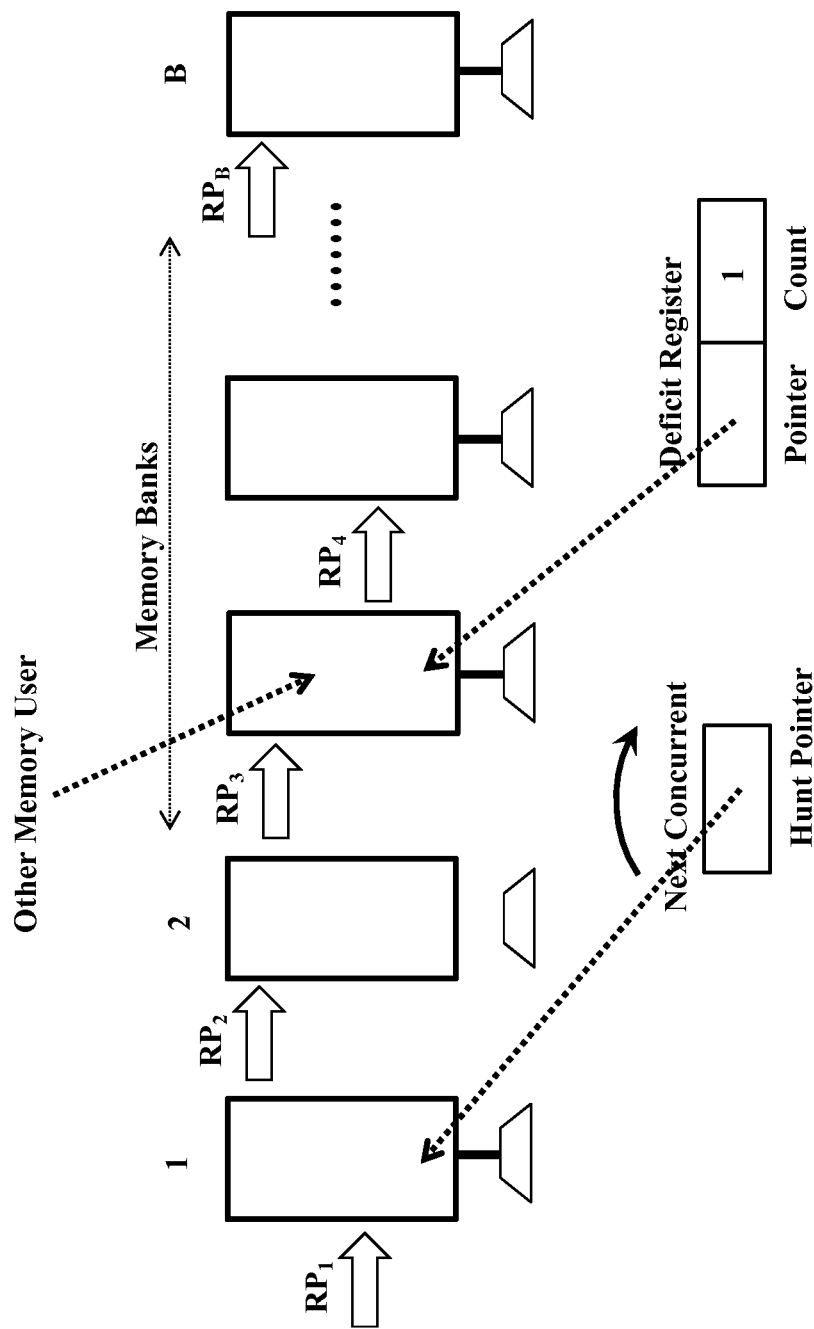
Figure 7N:
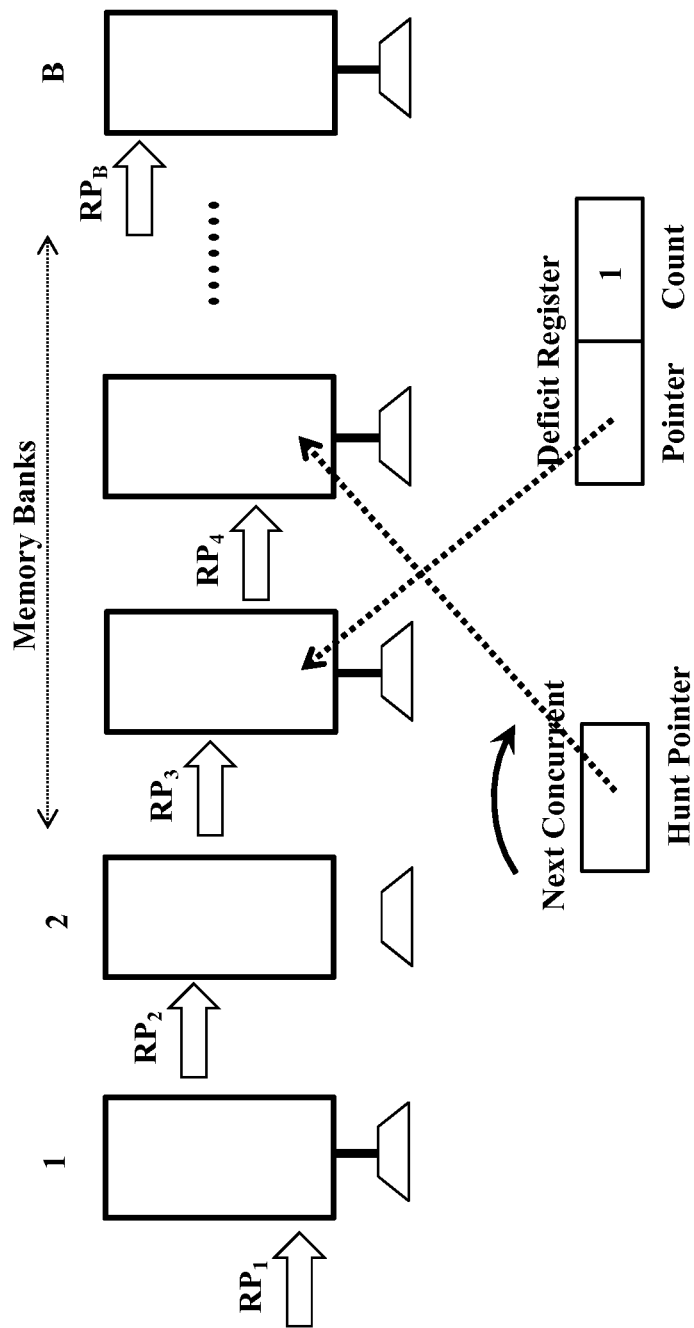
Figure 7P:
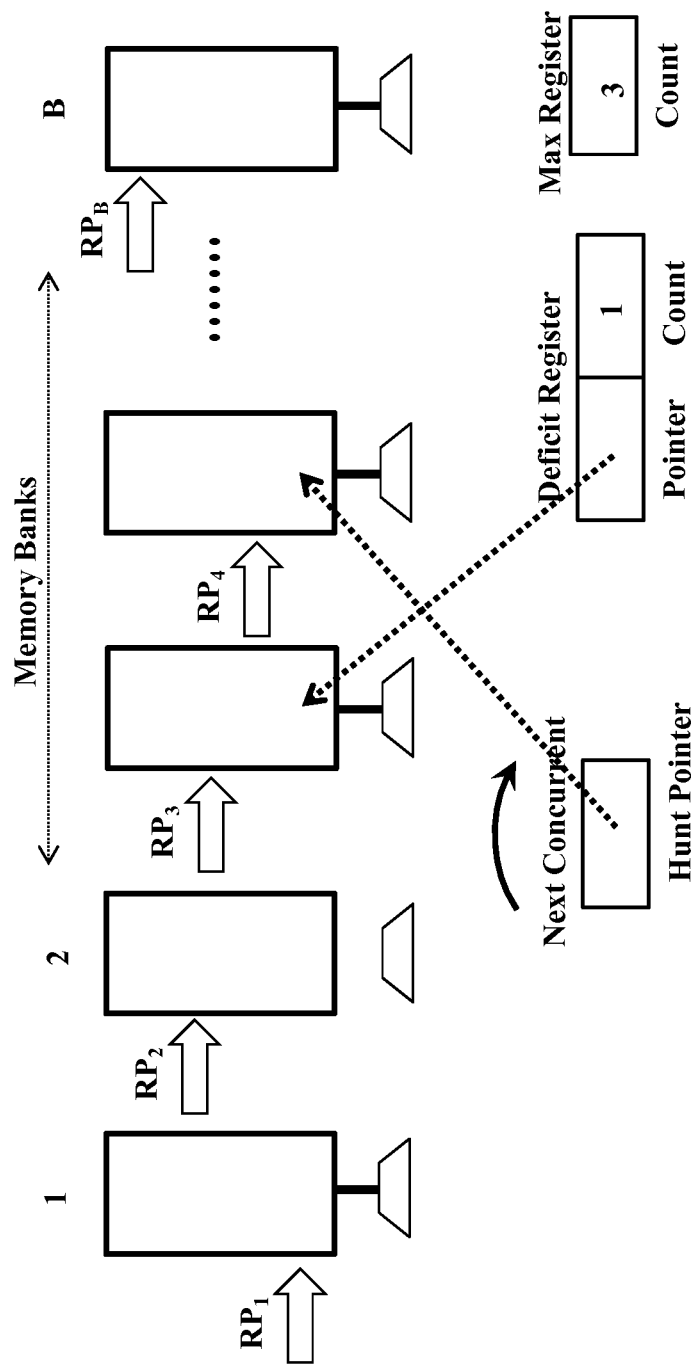

To describe how the ActiveTest system operates, a detailed example is presented with reference to FIGS. 7A to 7P. FIG. 7A illustrates a block diagram of a memory system constructed with B different memory banks Each memory bank in the memory system may be independently accessed. As long as the ActiveTest system and a normal memory user attempt to access different memory banks in the memory system of FIG. 7A, the two different memory accesses may occur simultaneously. Conversely, if a normal memory user and the ActiveTest system attempt to access the same memory bank of the memory system simultaneous then only one of the two can access that memory bank.

FIG. 7B illustrates the memory system of FIG. 7A wherein each of the B memory banks has been assigned a row pointer (RP) in the ActiveTest system that designates the next row to test with the ActiveTest system. During each timeslot assigned to the ActiveTest system, the ActiveTest system tests one row from one of the B memory banks and then advances the row pointer (RP) for that memory bank to the next row of the memory bank.

FIG. 7C illustrates the memory system of FIG. 7B wherein a hunt pointer has been added to point to one of the B memory banks that will be tested with the ActiveTest system. In normal operation, the hunt pointer will be advanced for each timeslot assigned to the ActiveTest system. In this manner, the ActiveTest system advances through the B banks consecutively and tests one row from the currently selected memory banks and then advances the row pointer (RP) for that memory bank to the next row. Thus, for example, in FIG. 7C the ActiveTest system will test memory bank 1 (since that is where the hunt pointer points to) and will test the row pointed to with row pointer $RP_1$.

FIG. 7D illustrates the memory system of FIG. 7C after the ActiveTest system has tested the row pointed to with row pointer $RP_1$ in memory bank 1. Note that the hunt pointer has been advanced to point to the next memory bank (memory bank 2) and that the row pointer $RP_1$ for memory bank 1 has been advanced to the next row that needs to be tested in memory bank 1. Similarly, in FIG. 7D the ActiveTest system will test memory bank 2 (since that is where the hunt pointer points to) and will test the row pointed to with row pointer $RP_2$.

FIG. 7E illustrates the memory system of FIG. 7D after the ActiveTest system has tested the row pointed to with row pointer $RP_2$ in memory bank 2. Note that the hunt pointer has been advanced to point to the next memory bank (bank 3) and that the row pointer $RP_2$ for memory bank 2 has been advanced to the next row (wrapping back to the first row in this example). In FIG. 7E the ActiveTest system attempts to test memory bank 3 (since that is where the hunt pointer now points to). However, as illustrated in FIG. 7F, if there is another normal memory user attempting to access the same memory bank (memory bank 3) then that other memory access will be allowed to proceed in order to maximize the memory system performance.

Since memory bank 3 is skipped in FIG. 7F, the ActiveTest system notes that memory bank 3 is skipped so the ActiveTest system can come back later and test that skipped memory bank. FIG. 7G illustrates a deficit register consisting of a deficit pointer that is used to point to the memory bank that has been skipped and deficit counter that counts how many times it has been skipped. FIG. 7H illustrates that the deficit point is set to point to bank 3 and the deficit counter is set to 1 to indicate that memory bank 3 has been skipped once. The ActiveTest system then advances to the next memory bank as illustrated in FIG. 7I.

Instead of testing a row in bank 3 that is blocked by the normal memory user, the ActiveTest system instead tests a row in bank 4 as illustrated in FIG. 7I. The ActiveTest system then advances the hunt pointer and the row pointer $RP_4$ for memory bank 4 as illustrated in FIG. 7J.

The ActiveTest system will proceed in the manner described in FIGS. 7A to 7J. The ActiveTest system may continually check to see if memory bank 3 can be tested but if it cannot be tested then it will continue testing other memory banks. FIG. 7K illustrates bank B being tested if memory bank 3 is blocked. FIG. 7L illustrates bank 1 being tested again if bank 3 remains blocked. FIG. 7M illustrates the ActiveTest system having wrapped back around to bank 3 but it is still unable to test bank 3. In such a case, the deficit count is increased to 2 since bank 3 has been skipped twice.

On the other hand, if bank 3 is no longer blocked then a row in bank 3 may be tested and the hunt pointer advances as illustrated in FIG. 7N. Note however that the deficit count remains at 1 since bank 3 is still 'behind' in the testing schedule.

All of the memory locations need to be tested on regular basis and should not be allowed to go untested for too long. Thus a maximum count register may be implemented as illustrated in FIG. 7P. The maximum count register specifies the maximum number of times that a bank may be skipped (maximum deficit) before the ActiveTest system will take priority and test a bank even if another memory user wishes to access the same memory bank. Thus, the maximum count register defines the burst tolerance (Y).

Advanced Round Robin Testing

A multi-bank memory system with concurrent testing capability should test every memory row in the memory system within a specified time period. The memory test circuitry can access any memory bank that is not currently involved in a memory read or memory write operation. Given these requirements, the designer of memory test circuitry needs to implement a test strategy that will ensure that no data is lost and minimizes the number of reserved test clock cycles. The present document proposes an advanced round robin memory test system that generally rotates through all the memory banks in a round robin fashion but prioritizes any memory banks that had to be temporarily skipped during a round due to a conflict with a memory read or write operation. The operation of an implementation of an advanced round robin testing system is disclosed with reference to FIGS. 8 and 9.

Figure 8:
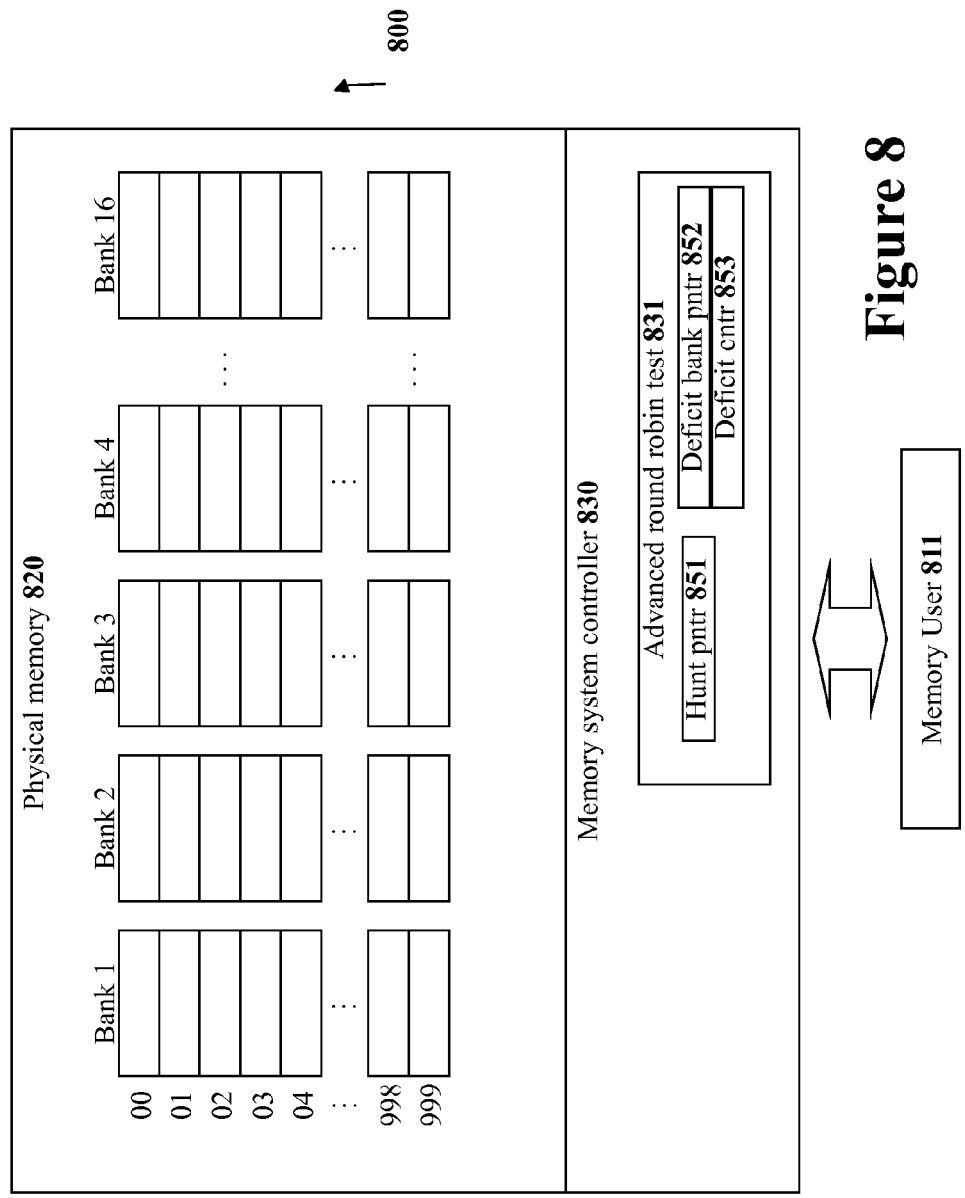
FIG. 8 illustrates a block diagram of a memory system with a concurrent testing system that uses advanced round robin testing.

Referring to FIG. 8, the advanced round robin test system 831 operates using a hunt pointer 851, a deficit bank pointer 852, and a deficit counter 853. The hunt pointer 851 points to the next memory bank that the advanced round robin test system 831 plans on testing in a round-robin rotation manner. The deficit bank pointer 852 points to memory bank has been skipped during a round of testing due to conflict with a read or write operation. And the deficit counter 853 stores how many times the bank identified in the deficit bank pointer 852 has been skipped (minus any subsequent test operations). Note that if the deficit counter 852 is zero then no memory bank is 'behind' on the testing schedule (and thus the current value in the deficit bank pointer is invalid).

For each individual memory bank, the advanced round robin test system 831 also maintains a row counter (not shown) that specifies which memory row of that memory bank will be tested next. The row counter for each memory bank operates in a normal round robin manner to have the memory test system circularly test through all the memory rows of the memory bank. Thus, there are nested round-robin loops: a main round-robin through the memory banks and round-robins within each memory bank.

Figure 9:
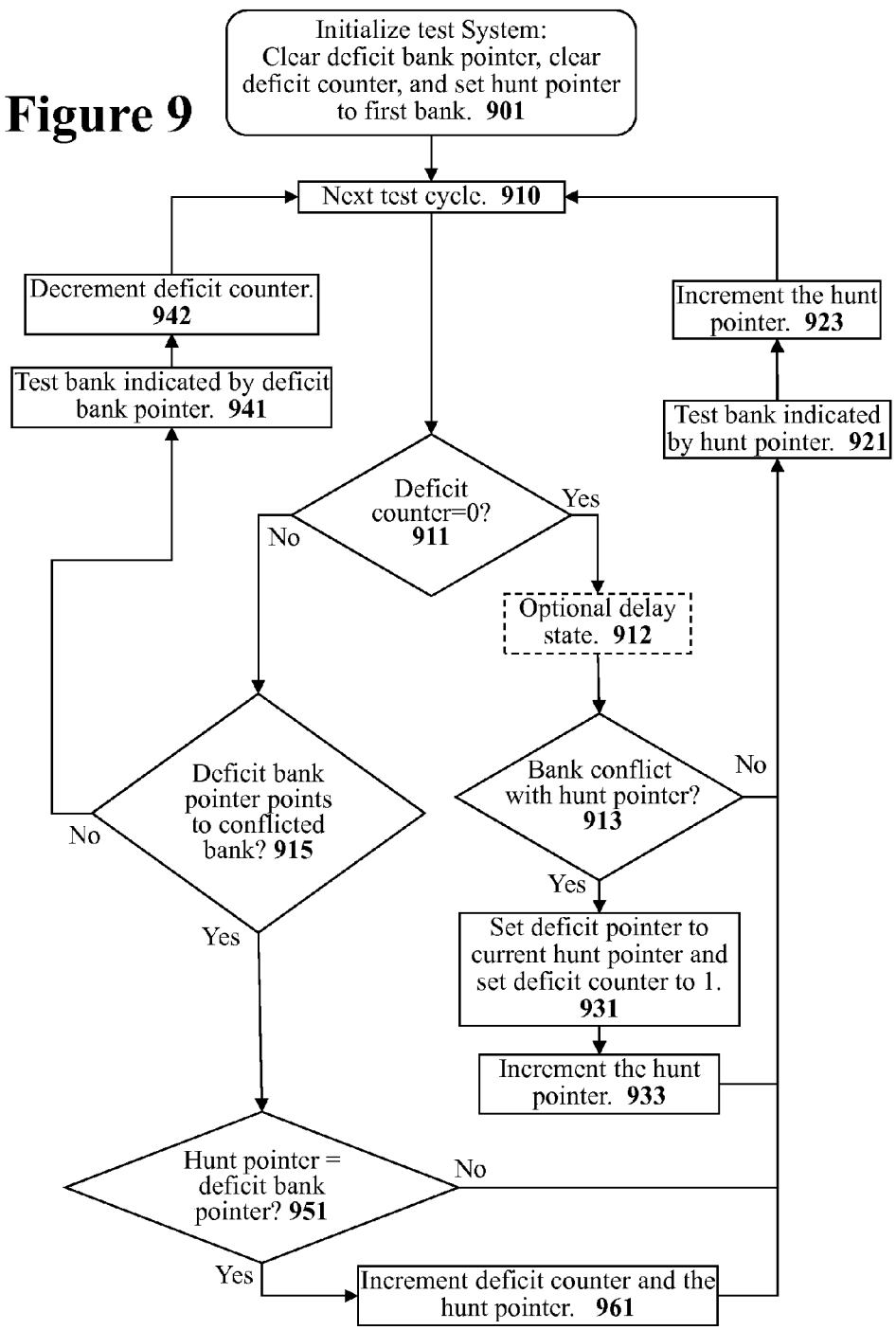
FIG. 9 illustrates a flow diagram describing the operation of an advanced round robin testing system for a digital memory system.

FIG. 9 illustrates a flow diagram that describes how one embodiment the advanced round robin test system 831 operates. Note that not all implementations will include these steps and some steps may be done in different orders in different implementations. FIG. 9 illustrates just one possible implementation of the general system.

When the memory system first receives power, the advanced round robin test system 831 initializes itself at stage 901. The advanced round robin test system 831 clears the deficit bank pointer 852 and a deficit counter 853 since no banks are blocked initially. The advanced round robin test system 831 sets the hunt pointer 851 to a first memory bank (such as bank 1) to be tested. The advanced round robin test system 831 then advances through stage 910 to the next memory cycle.

At the start of each memory cycle, the advanced round robin testing system 831 first determines if there is a memory bank that had been skipped during an earlier round of the test cycle by testing if the deficit counter 853 is zero at stage 911. If the deficit counter 853 is zero (meaning no skipped bank) then the advanced round robin test system 831 can proceed to stage 913 to attempt a normal test of the memory bank pointed to by the hunt pointer 851.

The first step when attempting a normal round robin test is to see if there is a memory bank conflict with a memory read or write operation. Specifically, at stage 913, the advanced round robin test system 831 determines if there is a current memory access (read or write) to the memory bank pointed to by the hunt pointer 851. The disclosed system gives priority to memory access operations. If there is no conflict, then the memory test system can test the memory bank pointed to by the hunt pointer 851 at stage 921, increment the hunt pointer 851 at stage 923, and proceed to the next memory cycle as stated in stage 910. The loop through stages 910, 911, 913, 921, and 923 is the normal round robin cycle that will occur as long as there are not memory bank conflicts.

Eventually, a user of the memory system and the advanced round robin test system 831 will attempt to access the same memory bank that the advanced round robin test system 831 is attempting to test such that a memory bank conflict occurs. Referring back to stage 913, when the advanced round robin test system 831 encounters the first memory bank conflict with a memory access (or any subsequent bank conflict when there is no memory bank behind on its test schedule), the advanced round robin test system 831 proceeds from stage 913 to stage 931. At stage 931, the advanced round robin test system 831 sets the deficit bank pointer 852 to the current value of the hunt pointer to indicate which memory bank has been blocked from a test. The advanced round robin test system 831 also sets the deficit counter 853 to 1 since this is the first time the blocked memory bank is being skipped. The advanced round robin test system 831 can then increment the hunt pointer 851 at stage 933 and proceed to test the next memory bank instead of the blocked memory bank. Specifically, the memory test system tests the memory bank pointed to by the hunt pointer 851 at stage 921, increments the hunt pointer 851 again at stage 923, and proceeds to the next memory cycle as stated in stage 910.

Referring back to stage 911, the first step of each test cycle is to determine if there is a memory bank that has been blocked from a test cycle such that it is 'behind' in its normal testing schedule. This may be done by testing the deficit counter 853 at stage 911. If there is deficit memory bank that had a test skipped then the advanced round robin test system 831 advances to stage 915 to determine if that memory bank that was skipped earlier is still blocked by a memory access. If that memory bank is no longer blocked then the advanced round robin test system 831 proceeds to stage 941 to test that memory bank that had been skipped in an earlier round using the deficit bank pointer 852. The advanced round robin test system 831 then decrements the deficit counter 853 at stage 942 and proceeds to stage 910 to handle the next test cycle.

Referring back to stage 915, if the deficit memory bank is still blocked then the advanced round robin test system 831 proceeds to stage 951 to test the next memory bank in the round-robin schedule as indicated by the hunt pointer 851. However, at stage 951, the advanced round robin test system 831 first tests to see if the hunt pointer 851 equals the deficit bank pointer 852. If the two values are not equal then the advanced round robin test system 831 can proceed with a normal test cycle. Specifically, the advanced round robin test system 831 proceeds to test the memory bank pointed to by the hunt pointer 851 at stage 921, increment the hunt pointer 851 at stage 923, and proceeds to the next test cycle at stage 910.

Referring back to stage 851, if the hunt pointer 851 equals the deficit bank pointer 852 then the advanced round robin test system 831 has proceeded through an entire test round of all the memory banks and the deficit memory bank continues to be blocked. In such a case, the advanced round robin test system 831 proceeds to stage 961 where it will increment the deficit counter 853 to indicate that the deficit memory bank has been skipped again for another test round and thus is further behind schedule. The advanced round robin test system 831 then increments the hunt pointer so that it can then test the next memory bank at stage 921, increment the hunt pointer 851 at stage 923, and proceed to the next test cycle at stage 910.

In some implementations, the advanced round robin test system 831 may include a test at stage 961 that tests to see if the deficit bank counter 853 has exceeded a threshold number of skipped test opportunities. If the test system has been blocked beyond the threshold number then test may take priority. However, in some embodiments such a test circuitry is not necessary since this situation will only occur if the memory user is not providing the specified minimum number of test cycles that allow the advanced round robin test system 831 to handle the worst case traffic pattern scenarios. Such circuitry would merely use up valuable layout area and only be activated when the memory user circuitry was implemented improperly.

Required Test Cycles

In a memory system with the advanced round robin test system as disclosed in

FIGS. 8 and 9, a memory user accesses a memory bank in the memory system while the advanced round robin test system 831 efficiently tests another memory bank of the memory system simultaneously. The memory user has priority over the test circuitry such that the memory request from a memory user is not stalled. Thus, the memory test system works around the memory users by testing memory rows in other memory banks However, certain memory access patterns by a memory user could potentially block the advanced round robin test system 831 from easily completing the duty of testing every memory cell in the memory system within a desired time period. For example, if a memory user continuously accesses the same memory bank then the test system would not be able to access that continuously accessed memory bank. Thus, the memory system will still require a specified number of reserved test cycles during a specified time period in order to test the rows of that continually accessed memory bank.

The minimum number of reserved test cycles that will be required is dependent upon several parameters of the memory system. Specifically, the number of reserved test cycles will be a function of a number of memory banks B in the memory system, a number of rows R in each memory bank, and the total number of memory cycles W that occur during each desired testing time period. The required minimum number of reserved test cycles can be expressed as X reserved test cycles in every Y continuous memory cycles. The value Y represents a sliding window of Y contiguous memory cycle. X is the minimum number of reserved test cycles that the memory user make available in every Y memory cycle window. Using mathematical proofs, a minimum ratio of total memory cycles (Y) in a window to require test cycles (X) has been determined. Specifically, in a system with the following assumptions:

1) A pattern of having X reserved test cycles in every Y memory cycles.
2) 1≤X≤R and R=aX+b, where 0≤b≤X−1
3) W≤2BR Then a memory access pattern that has the following total-cycles to reserved-test cycles ratio (Y/X) will ensure that every row in every memory bank will be tested within the designated testing time period:

$$\text{(i) If } b = 0 \text{ then } \frac{Y}{X} \leq \frac{W - (B-1)X - R}{R}$$

$$\text{(i) If } b > 0 \text{ then } \frac{Y}{X} \leq \frac{W - Bb + X - R}{(a+1)X}$$

As long as the memory user includes reserved test cycles that comply with the above ratio, the advanced round robin test system will always test all of the rows in the memory system such that every memory cell is tested regularly. Note that there are no stalls caused by conflicts with the test system such that the memory system will always guarantee an immediate response to a memory request.

Assuming that the number of memory cycles W during each designated testing time period is large enough to allow all of the rows of a particular memory system to be tested, a designer may calculate the needed sliding window size Y that is needed for a given reserved test cycle value X using the following formula:

$$Y = \begin{cases} W - (B-1)R - \left\lceil \frac{W}{B} \right\rceil + X & \text{if } RB \leq W \leq (R+X)B \\ \left\lfloor \frac{W - bB - 1}{a+1} \right\rfloor & \text{if } W > (R+X)B \end{cases}$$

Note that in this document $\lfloor x \rfloor$ and $\lceil x \rceil$ denote the floor and ceiling functions respectively.

Reducing Test Cycles

In the advanced round robin testing system as disclosed in FIGS. 8 and 9, the advanced round robin test system 831 may test a memory row during every memory cycle. However, depending on the designated testing time period, the clock rate, the number of memory banks, and the number of rows in each memory bank; testing a row every memory cycle may end up testing the rows of the memory system far more frequently than the rows actually need to be tested. Testing the memory rows more frequently than necessary will only slightly improve the system and may have undesirable side effects. Specifically, testing the memory rows more than necessary causes the memory system to consume more power than necessary and generates more heat that must be dissipated by the integrated circuit device. Thus, various methods of controlling the test system may be introduced to improve energy efficiency of the memory system.

One method of adjusting the test system is to invoke the memory test system less frequently than every cycle. For example, the test system may be invoked every 2 memory cycles, every 3 memory cycles, or some other schedule that ensures adequate testing of memory rows but without unnecessary energy usage.

In another implementation, the memory test system may be adaptive. The test system may operate in one mode during normal operations but in another mode when the electronic device that the integrated circuit is used within is in a 'sleep' mode. For example, a portable consumer electronics device that is not currently being used may need to keep data stored but use a minimal amount of energy when the user is not using the device. In such situation, there may be no memory users making memory requests such that test system may enter a low-power state wherein memory test operations are issued at a minimal rate. In such a state, the test system may not have to handle both testing and memory access operations simultaneously.

In some embodiments, the test schedule may be determined using a function of the number of banks B in the memory system, the number of rows R in each memory bank, and the number of operating cycles W during the designated testing time period. In this manner, the optimal test schedule may be determined based upon the specific size and speed parameters of the specific memory system.

In some embodiments, the test system may adjust its operation depending on the number of conflicts between the memory user and the testing system. When there is no conflicts between the memory user and the testing system then the testing system will not 'fall behind' on its test schedule such that a slower test rate is possible. However, when a large number of conflicts between the memory user and the testing system occur, the test system may fall behind on its test schedule such that the testing system will need to 'catch up' on test operations for memory banks that were skipped due to a memory conflict. One possible implementation of a self-adjusting system is illustrated in the flow diagram of FIG. 9.

Referring to stage 911, at the beginning of each potential test cycle the test system tests the deficit counter to see if there are any memory banks that are behind on their testing schedule. If the deficit counter is not zero (thus indicating that a memory banks is behind on its testing schedule) then the testing system proceeds to stage 915 where the testing system attempts to test the deficit memory bank. But when the deficit counter is zero (indicating that the test system is on its normal test schedule) then the testing system may enter a delay stage 912 where the test system may delay the next test operation. During the delay stage, the testing system may allow one or more operating cycles to pass such that extra energy-wasting testing operations are not performed. Thus, with the delay stage 912, the testing system only introduces time delays when the test system is on schedule. If the memory testing system falls behind, it will always attempt to test the skipped memory bank.

Note that the size of the Y cycle wide sliding window of Y contiguous memory cycles and the minimum number of reserved test cycles X that the memory user make available in every Y memory cycle window may vary for each different memory system depending on the testing rates, the memory technology used, and other factors.

ActiveTest System Performance

The ActiveTest system is an optimized system for continually testing memory without getting in the way of memory users that access the memory system. FIG. 10A lists the overhead required for a memory system with B banks, R rows, and a hunt time of W. FIG. 10B lists the sufficiency for an ActiveTest system (with parameter X).

Figure 11:
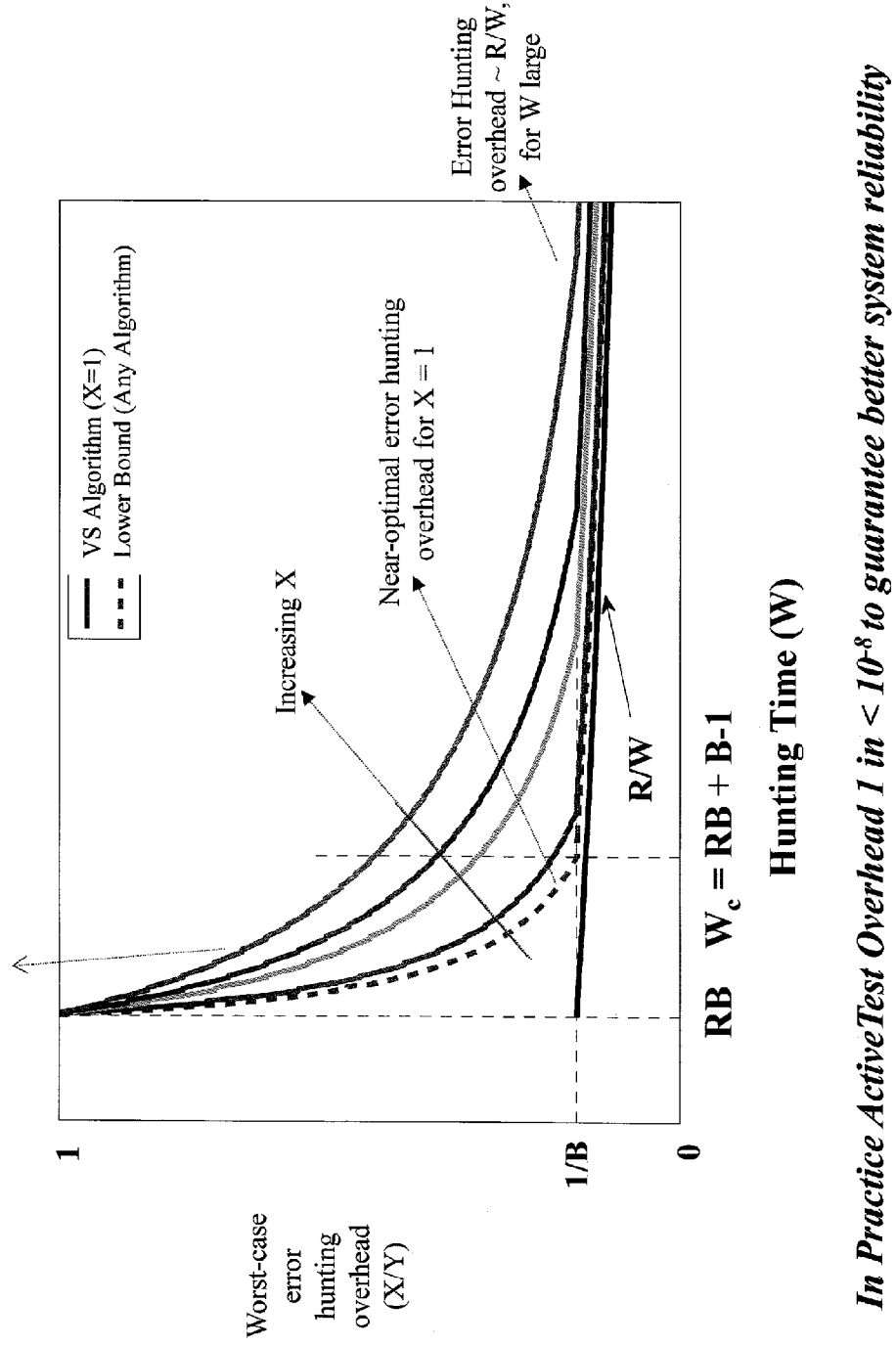
FIG. 11 illustrates the performance guarantees of an ActiveTest system. Note that various different numbers of reserved timeslots were tested. A near optimal error hunting overhead for X=1 was noted.

FIG. 11 illustrates the performance guarantees of an ActiveTest system. Note that various different numbers of reserved timeslots were tested. A near optimal error hunting overhead for X=1 was noted. FIG. 12 illustrates the improvement of reducing catastrophic errors with the ActiveTest system.

The disclosed ActiveTest system provides many benefits. In particular, the ActiveTest system can alleviate system memory downtime by over $10^8$. ASIC manufacturing and chip vendors will realize several benefits. The testing system can be inserted in a drop-in mode such that there are no changes to the functional memory interface. The testing system may be tightly coupled such that there is only minimal software intervention. The system is stateless such that no ROM storage is required. The system complements existing BIST and BISR systems. The system is also configurable such that it allows configurations of repair tolerances in the field.

Applicability For Memory Virus Testing

A memory testing system has been disclosed for testing memory circuitry in the background while a memory system is being used. However, the same techniques can be used for other applications. For example, the same system can be used to search a memory system for viruses that may have been introduced into a computer system.

In one embodiment, the memory control is provided with the hash of several potential virus threats. The disclosed system can proceed through the memory system and test for a hash of a known virus threat. If a potential threat is located then secondary testing system may be alerted wherein the secondary system. Further tests the potential threats since the initial testing may identify false positives.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

We claim:

1. A digital memory system, said digital memory system comprising:
    a set of memory banks, each of said memory banks able to be accessed independent of the other memory banks in said set of memory banks, each of said memory banks comprising a plurality of memory rows; and
    a memory testing system for testing said set of memory banks, said memory testing system comprising
        a hunt pointer for pointing to a next memory bank to be tested, said memory testing system skipping said next memory bank when a memory access is currently blocking access said next memory bank;
        a first deficit bank pointer for identifying a first deficit memory bank that has been skipped from a recent testing attempt due to a blocking memory access, and
        a first deficit counter associated with said first deficit bank pointer, said first deficit counter for storing a count of times said first deficit memory bank has been skipped for testing;
    wherein said first deficit memory bank identified in said first deficit bank pointer is given priority for testing over said next memory bank pointed to by said hunt pointer when said first deficit counter is not zero.

2. The digital memory system as set forth in claim 1 wherein said memory testing system further comprises a memory row pointer for each memory bank in said set of memory banks.

3. The digital memory system as set forth in claim 1 wherein said memory test system decrements said first deficit bank counter upon testing said first deficit memory bank identified by said first deficit bank pointer.

4. The digital memory system as set forth in claim 1 wherein said memory testing system increments said hunt pointer upon testing said next memory bank identified by said hunt pointer.

5. The digital memory system as set forth in claim 1 wherein said memory testing system further comprises
    a second deficit bank pointer for identifying a second deficit memory bank that has been blocked from a recent testing attempt, and
    a second deficit counter associated with said second deficit bank pointer, said second deficit counter for storing a count of times said second deficit memory bank has been skipped for testing;
    wherein said first deficit memory bank identified in said first deficit bank pointer is given priority over said next memory bank pointed to by said hunt pointer when said first deficit counter is not zero and said second deficit memory bank identified in said second deficit bank pointer is given priority over said next memory bank pointed to by said hunt pointer when said second deficit counter is not zero.

6. The digital memory system as set forth in claim 5 wherein when both said first deficit counter and said second deficit counter are non zero, said memory testing system determines the greater value of said first deficit counter and said second deficit counter and then attempts to test a memory bank associated with the greater value.

7. The digital memory system as set forth in claim 5 wherein when both said first deficit counter and said second deficit counter are non zero, said memory testing system attempts to test either said first deficit memory bank identified by said first deficit bank pointer or said second deficit memory bank identified by said second deficit bank pointer on a round robin basis.

8. The digital memory system as set forth in claim 5 wherein when both said first deficit counter and said second deficit counter are non zero, said memory testing system randomly selects either said first deficit memory bank identified by said first deficit bank pointer or said second deficit memory bank identified by said second deficit bank pointer for testing.

9. The digital memory system as set forth in claim 5 wherein when both said first deficit counter and said second deficit counter are non zero, said memory testing system randomly selects either said first deficit memory bank identified by said first deficit bank pointer or said second deficit memory bank identified by said second deficit bank pointer depending on which was blocked earlier.

10. The digital memory system as set forth in claim 1 wherein said digital memory system comprises an embedded dynamic memory system.

11. A method of testing memory cells in a multi-bank dynamic memory system, said method of testing memory cells comprising:
   testing memory banks in said multi-bank dynamic memory system in a nominal round-robin manner;
   skipping a test of a first deficit memory bank when there is a conflict with a first memory access accessing said first deficit memory bank; and
   immediately testing said first deficit memory bank when there is no longer a conflict with a memory access accessing said first deficit memory bank.

12. The method of testing memory cells in a multi-bank dynamic memory system as set forth in claim 11 wherein a first deficit bank pointer is used to identify said first deficit memory bank skipped during a testing round.

13. The method of testing memory cells in a multi-bank dynamic memory system as set forth in claim 12 wherein a first deficit counter is used to identify a number of number of testing cycles that have consecutively skipped said first deficit memory bank.

14. The method of testing memory cells in a multi-bank dynamic memory system as set forth in claim 13 further comprising:
   decrementing said first deficit counter upon testing said first deficit memory bank.

15. The method of testing memory cells in a multi-bank dynamic memory system as set forth in claim 11 wherein a hunt pointer is used to identify a next memory bank to test.

16. The method of testing memory cells in a multi-bank dynamic memory system as set forth in claim 15 further comprising
   incrementing said hunt pointer after testing a next memory bank identified by said hunt pointer.

17. The method of testing memory cells in a multi-bank dynamic memory system as set forth in claim 15 further comprising
   skipping a test of a second deficit memory bank when there is a conflict with a second memory access accessing said second deficit memory bank; and
   immediately testing said first deficit memory bank or second deficit memory bank when there is no longer a conflict with accessing said first deficit memory bank or said second deficit memory bank.

18. The method of testing memory cells in a multi-bank dynamic memory system as set forth in claim 17 wherein said method tests said first deficit memory bank or second deficit memory bank depending on which has been skipped the greater number of times.

19. The method of testing memory cells in a multi-bank dynamic memory system as set forth in claim 17 wherein said method tests said first deficit memory bank or second deficit memory bank on a random basis.

20. The method of testing memory cells in a multi-bank dynamic memory system as set forth in claim 17 wherein said method tests said first deficit memory bank or second deficit memory bank on a round robin basis.

21. The method of testing memory cells in a multi-bank dynamic memory system as set forth in claim 17 wherein said method tests said first deficit memory bank or second deficit memory bank depending on which was skipped earlier.

* * * * *